United States Patent
Sakurai

(10) Patent No.: US 9,238,278 B2
(45) Date of Patent: Jan. 19, 2016

(54) SOLDER TRANSFER SUBSTRATE, MANUFACTURING METHOD OF SOLDER TRANSFER SUBSTRATE, AND SOLDER TRANSFER METHOD

(75) Inventor: Daisuke Sakurai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 83 days.

(21) Appl. No.: 14/005,874

(22) PCT Filed: Jan. 25, 2012

(86) PCT No.: PCT/JP2012/000462
§ 371 (c)(1),
(2), (4) Date: Sep. 18, 2013

(87) PCT Pub. No.: WO2012/132175
PCT Pub. Date: Oct. 4, 2012

(65) Prior Publication Data
US 2014/0010991 A1    Jan. 9, 2014

(30) Foreign Application Priority Data

Mar. 29, 2011 (JP) ................................ 2011-073235

(51) Int. Cl.
*B23K 35/02* (2006.01)
*B23K 1/00* (2006.01)
(Continued)

(52) U.S. Cl.
CPC .......... *B23K 35/0244* (2013.01); *B23K 1/0016* (2013.01); *B23K 1/20* (2013.01); *B23K 3/0623* (2013.01); *B23K 35/26* (2013.01); *B23K 35/262* (2013.10); *B23K 35/362* (2013.01); *B23K 35/40* (2013.01); *C22C 1/02* (2013.01); *C22C 13/00* (2013.01); *H01L 24/11* (2013.01);

*H01L 24/13* (2013.01); *H05K 3/3484* (2013.01); *B22F 7/004* (2013.01); *B23K 2201/42* (2013.01); *H01L 2224/111* (2013.01); *H01L 2224/11003* (2013.01); *H01L 2224/1182* (2013.01); *H01L 2224/11332* (2013.01); *H01L 2224/11849* (2013.01); *H01L 2224/13022* (2013.01);
(Continued)

(58) Field of Classification Search
None
See application file for complete search history.

(56) References Cited

U.S. PATENT DOCUMENTS 5,366,573 A * 11/1994 Bayer et al. ..................... 156/64
5,591,037 A     1/1997 Jin et al.
(Continued)

FOREIGN PATENT DOCUMENTS

| CN | 1471565 | 1/2004 |
|---|---|---|
| JP | 05-198933 A | 8/1993 |

(Continued)

OTHER PUBLICATIONS

Machine Translation of JP 10070151 A, Mar. 1998.*
(Continued)

*Primary Examiner* — Jeff Vonch
(74) *Attorney, Agent, or Firm* — RatnerPrestia

(57) ABSTRACT

A solder transfer substrate, including: a base layer; an adhesive layer arranged on the base layer; and plural solder powders arranged on the adhesive layer, wherein in the base layer, which is a porous member, a plurality of holes, which allow at least a peeling-off liquid to pass therethrough, are formed from a side thereof on which the adhesive layer is not arranged to a side thereof on which the adhesive layer is arranged. Particularly, the adhesive layer has a characteristic of expanding with the peeling-off liquid infused.

6 Claims, 16 Drawing Sheets

(51) Int. Cl.
 *B32B 3/24* (2006.01)
 *B32B 3/30* (2006.01)
 *B23K 1/20* (2006.01)
 *B23K 3/06* (2006.01)
 *B23K 35/26* (2006.01)
 *H01L 23/00* (2006.01)
 *C22C 13/00* (2006.01)
 *B23K 35/362* (2006.01)
 *B23K 35/40* (2006.01)
 *C22C 1/02* (2006.01)
 *B22F 7/00* (2006.01)
 *H05K 3/34* (2006.01)

(52) U.S. Cl.
 CPC .......... *H01L2224/1357* (2013.01); *H01L 2224/13144* (2013.01); *H01L 2224/13155* (2013.01); *H01L 2224/13562* (2013.01); *H01L 2224/13578* (2013.01); *H01L 2224/13609* (2013.01); *H01L 2224/13611* (2013.01); *H01L 2224/94* (2013.01); *H01L 2924/00013* (2013.01); *H01L 2924/01029* (2013.01); *H01L 2924/15788* (2013.01); *H05K 3/3436* (2013.01); *H05K 2203/0425* (2013.01); *Y10T 428/24322* (2015.01)

(56) References Cited

U.S. PATENT DOCUMENTS

| | | | |
|---|---|---|---|
| 5,846,366 A | | 12/1998 | Jin et al. |
| 6,145,735 A | * | 11/2000 | Mallery ............... B23K 1/008 228/254 |
| 6,239,013 B1 | * | 5/2001 | Hotchkiss ........... H01L 21/6835 257/737 |
| 6,287,891 B1 | * | 9/2001 | Sayyah ............... H01L 21/6835 438/106 |
| 7,147,743 B2 | | 12/2006 | Kiuchi |
| 2002/0062988 A1 | | 5/2002 | Mitani et al. |
| 2004/0003883 A1 | | 1/2004 | Kiuchi |
| 2004/0231793 A1 | * | 11/2004 | Kroninger et al. ............ 156/344 |
| 2005/0173064 A1 | * | 8/2005 | Miyanari ...................... 156/344 |
| 2006/0110907 A1 | | 5/2006 | Sakurai et al. |
| 2008/0213613 A1 | | 9/2008 | Kuramoto et al. |

FOREIGN PATENT DOCUMENTS

| | | | |
|---|---|---|---|
| JP | 07-336033 A | 12/1995 | |
| JP | 08-288632 A | 11/1996 | |
| JP | 10-075043 A | 3/1998 | |
| JP | 10070151 A * | 3/1998 | ............ H01L 21/60 |
| JP | 2000-094179 A | 4/2000 | |
| JP | 2002-190661 A | 7/2002 | |
| JP | 2004311744 | 11/2004 | |
| JP | 2006-114735 A | 4/2006 | |
| JP | 2009-010302 A | 1/2009 | |
| WO | 0233017 | 4/2002 | |
| WO | WO 2006/067827 A1 | 6/2006 | |

OTHER PUBLICATIONS

International Search Report for Application No. PCT/JP2012/000462, dated May 1, 2012.

Chinese Office Action mailed Oct. 28, 2015 for Chinese Application No. 201280015167.4, including partial English translation.

* cited by examiner

FLOW OF PEELING-OFF
LIQUID

FLOW OF PEELING-OFF LIQUID

SOLDER TRANSFER SUBSTRATE, MANUFACTURING METHOD OF SOLDER TRANSFER SUBSTRATE, AND SOLDER TRANSFER METHOD

CROSS-REFERENCE TO RELATED APPLICATIONS

This application is a U.S. national phase application of PCT International Patent Application No. PCT/JP2012/000462 filed Jan. 25, 2012, claiming the benefit of priority of Japanese Patent Application No. 2011-073235 filed Mar. 29, 2011, all of which are incorporated by reference herein in their entirety.

TECHNICAL FIELD

The present invention relates to a solder transfer substrate, a manufacturing method of a solder transfer substrate and a solder transfer method.

BACKGROUND ART

In recent years, to further cope with both high density of a semiconductor element and high pin count of electrode terminals, narrow pitch and area reduction of electrode terminals of a semiconductor element have been aimed for.

Usually, in flip-chip mounting, mounting is carried out by forming protruding electrodes such as solder bumps and the like on the electrode terminals of a semiconductor element such as an LSI and the like, melting the solder layers formed beforehand on the electrode terminals through pressing with heating of the semiconductor element turned face down against the connection terminals of the mounting board, and allowing connection to be carried out.

But, because the progress for narrow pitch is remarkable, when one line or two lines of the electrode terminals of the semiconductor element are arranged, as conventionally, in the outer periphery part by a means in a staggered manner, a short circuit may occur between the electrode terminals, and connection inferiority and the like may occur due to a difference in thermal expansion coefficients between the semiconductor element and the mounting board. Accordingly, a method of widening, by arranging the electrode terminals in the form of an area, the pitch between the electrode terminals has been taken, but the progress for narrow pitch becomes remarkable in recent years also in an area arrangement, and strict requirements are demanded also regarding the solder layer formation technique on the electrode terminals of a semiconductor element or a mounting board.

Conventionally, as a technique for solder layer formation onto electrode terminals of the semiconductor element, a plating method or a screen printing method, a ball mounting method and the like are used, but the plating method, which is suited for narrow pitch, has problems of productivity in that the step becomes complicated, and in that a facility line increases in size.

Moreover, it is difficult for the screen printing method or the ball mounting method, which is superior in productivity, to deal with narrow pitch because a mask is used.

In a situation like this, several techniques are proposed for selectively forming solder on the electrode terminals of an LSI element or the connection terminals of a circuit board in recent years (for example, see Japanese published patent application 2000-094179). These techniques, which are not only suited for formation of fine bumps but also superior in productivity because the solder layers can be formed en bloc, begin to be noticed.

As for the above mentioned techniques, in the technique proposed in Japanese published patent application 2000-094179, in the first place, a solder paste with a mixture of solder powders such that oxide films have been formed on the surfaces and a flux is applied to the whole area on the circuit board on which the connection terminals are formed. And, by heating the circuit board in that state, the solder powders are allowed to be melted, and the solder layers are selectively formed on the connection terminals without causing short circuits between the contiguous connection terminals.

However, in this solder layer formation method, because the intervals between the electrode terminals are narrow, even if washing after the solder paste melting is performed, unmelted solder powders or flux components remain between the electrode terminals, and the problem is that, under a usage environment after the flip-chip mounting, bridge inferiority or migration inferiority occurs.

As a method of solving these problems, proposed is a solder layer formation technique of allowing solder powders to selectively attach onto the electrode terminals by superposing a support medium, to which the solder powders are attached, on a semiconductor element or a circuit board, and carrying out heating and pressurization (for example, see WO2006/067827 pamphlet).

FIGS. 9(a)-(e) are explanatory drawings of the step of performing solder layer formation (precoating) proposed in WO2006/067827 pamphlet, which allows the solder to attach to the soldering part of the work beforehand. In what follows, that step is described.

In the first place, the adhesive agent 52 is applied to one side of the support medium 51 (FIG. 9(a)).

Next, the powder solders 53 are sprinkled on the adhesive agent 52, which has been applied to the support medium 51, to an extent such that the adhesive agent 52 is hidden (FIG. 9(b)).

After that, by raking the powder solders 53 on the support medium 51 with the brush 54, the redundant powder solders 53 that are not adhered to the adhesive agent 52 are removed, and the powder solders 53 are allowed to be uniform (FIG. 9(c)).

On the other hand, the liquid flux 58 is applied, with the spray fluxer 57, to the face on which the soldering part 56 of the work 55 is formed (FIG. 9(d)). The numeral 59 denotes the resist.

Next, the flux application face of the work 55 and the powder solder adhesion face of the support medium 51 are superposed. At this time a pressure is exerted between the work 55 and the support medium 51 from above the support medium 51 with a pressing machine that is not shown. Then, because the adhesive agent 52 has flexibility and followability, the powder solders 53 that have been adhered to the adhesive agent 52 come into contact with the soldering part 56 when the pressure is exerted against the support medium 51 (FIG. 9(e)).

And, when the superposed work 55 and support medium 51 are heated and pressurized with a heating device that is not shown, the powder solders 53 are diffused at the interface with the soldering part 56 and joined thereto. And, after cooling, when the support medium 51 is removed from the work 55, the powder solders 53 that have been diffused at the interface with the soldering part 56 and joined thereto are left on the soldering part 56, and the powder solders 53 on the resist 59 are removed along with the support medium 51.

After that, the solder layers are formed, in case the work 55 is a semiconductor element, on the electrode terminals by melting the powder solders 53 on the soldering part 56 with a reflow furnace.

With this solder layer formation method, solder layers can be formed also on the narrow-pitch electrode terminals, it is not necessary to perform a complicated step with a large-sized facility line like electrolytic plating, and production can be easily carried out with high productivity.

SUMMARY OF THE INVENTION

Problems to be Solved by the Invention

However, when the solder layer formation technique of WO2006/067827 pamphlet as mentioned above is used with respect to a semiconductor element with a low-dielectric-constant film used as the interlayer insulating film or a circuit board on which fragile electrode terminals are formed, the problem is that, while the solder transfer substrate that is one example of the solder attaching support medium described above is peeled off, a low-dielectric-constant film or electrode pads peel off.

For the purpose of coping with a design rule becoming finer or high-speed signal processing that is required in recent years, a low-dielectric-constant film (so-called a low-k film, a ULK (Ultra Low-k) film or the like) has been used as the interlayer insulating film of a semiconductor element. A low-dielectric-constant film itself is allowed to be porous and have many empty holes of several nanometers in order to lower the dielectric constant (the density for a low dielectric constant is 1.0-1.4 g/cm$^3$, for example).

FIGS. 10(*a*) and (*b*) show enlarged sectional views that conceptually show the step of forming solder layers, using the solder layer formation technique of WO2006/067827 pamphlet mentioned above, on such electrode terminals on a semiconductor element having the fragile low-dielectric-constant film 67.

As is shown in FIG. 10(*a*), the solder transfer substrate 65 comprises the substrate 64 with the thickness s1, the adhesive agent 62 with the thickness a1 formed thereon, and the solder powders 63 arranged thereon. On the other hand, for the semiconductor element 66 having the fragile low-dielectric-constant film 67, on its surface on the side near to the solder transfer substrate 65, the protruding electrode 68 is formed on the electrode pad 69.

As is shown in FIG. 10(*b*), in the step of pushing the solder transfer substrate 65 against the semiconductor element 66 having the protruding electrodes 68 and carrying out heating, the adhesive agent 62 and the protruding electrode 68 are bonded with each other.

At this time, small is the compression quantity of the adhesive layer thickness a2 at the locations where it does not come into contact with the protruding electrode 68, while the adhesive layer thickness b2 that touches the protruding electrode 68 is largely compressed. Namely, there is a relation such that a1≅a2>b2. Because of that, a large compression stress is added on the adhesive layer on the protruding electrode 68, and the adhesive agent 62, and the solder powders 63 and protruding electrode 68 are rigidly bonded.

Since such bonding strength between the adhesive agent 62 and the protruding electrodes 68 is more than the strength of the fragile low-dielectric-constant film 67, the problem is that, as shown in FIG. 10(*c*), in the step of peeling off the solder transfer substrate 65, in the fragile low-dielectric-constant film 67 under the electrode pads 69, separation is generated.

Moreover, in a case where a circuit board is used as the work 55, for example, also in a circuit board and the like such that electrode pads made of Cu, whose adhesion force with Si is weak, are formed on the circuit board made of silicone, in the case where the solder layers are formed by using the solder layer formation technique of WO2006/067827 pamphlet mentioned above, similarly to the above-mentioned, the problem is, while a solder transfer substrate is peeled off, fragile electrode pads peel off from the circuit board.

The present invention, in consideration of the problems of the conventional solder transfer substrate, furnishes a solder transfer substrate, a manufacturing method of a solder transfer substrate, and a solder transfer method using a solder transfer substrate such that a solder transfer substrate is easy to smoothly peel off.

Means for Solving the Problem

In order to solve the problems mentioned above, the 1$^{st}$ aspect of the present invention is
a solder transfer substrate, comprising:
a base layer;
an adhesive layer arranged on the base layer; and
plural solder powders arranged on the adhesive layer, wherein
in the base layer, a plurality of holes, which allow at least a peeling-off liquid to pass therethrough, are formed from a side thereof on which the adhesive layer is not arranged to a side thereof on which the adhesive layer is arranged.

The 2$^{nd}$ aspect of the present invention is
a solder transfer substrate according to the 1$^{st}$ aspect of the present invention, wherein
the adhesive layer has a characteristic of expanding with the peeling-off liquid infused.

The 3$^{rd}$ aspect of the present invention is
a solder transfer substrate according to the 1$^{st}$ aspect of the present invention, wherein
the base layer is a porous member.

The 4$^{th}$ aspect of the present invention is
a solder transfer substrate according to the 1$^{st}$ aspect of the present invention, wherein
the plurality of holes are provided so as to penetrate from a face of the base layer, which does not touch the adhesive layer, towards a face of the base layer, which touches the adhesive layer.

The 5$^{th}$ aspect of the present invention is
a solder transfer substrate according to the 4$^{th}$ aspect of the present invention, wherein
the plurality of holes are formed at least to an inside of the adhesive layer.

The 6$^{th}$ aspect of the present invention is
a solder transfer substrate according to the 1$^{st}$ aspect of the present invention, wherein
the base layer is larger than the adhesive layer in respect of a compression rate at a time of heating.

The 7$^{th}$ aspect of the present invention is
a manufacturing method of a solder transfer substrate, comprising:
an adhesive layer forming step of forming an adhesive layer on a surface of a base layer having a plurality of holes; and
a solder powder loading step of loading, on the adhesive layer, plural solder powders with in-between spaces.

The 8$^{th}$ aspect of the present invention is
a manufacturing method of a solder transfer substrate, comprising:

an adhesive layer forming step of forming an adhesive layer on a surface of a base layer;

a solder powder loading step of loading, on the adhesive layer, plural solder powders with in-between spaces; and a penetration step of forming a hole penetrating at least the base layer.

The 9$^{th}$ aspect of the present invention is a solder transfer method, comprising:

a solder joining step of superposing the solder transfer substrate according to the 1$^{st}$ aspect of the present invention, and a circuit board or an electronic component with an electrode formed on a surface thereof, so that a face on which the solder powders have been loaded faces a face on which the electrode has been formed, carrying out heating and pressurization, and allowing the solder powders to be joined to the electrode;

a peeling-off liquid infiltrating step of allowing a peeling-off liquid to infiltrate the adhesive layer via a plurality of holes provided in the base layer; and a transfer substrate peeling-off step of peeling off the solder transfer substrate from the circuit board or the electronic component.

The 10$^{th}$ aspect of the present invention is a solder transfer method, comprising:

a solder joining step of superposing the solder transfer substrate according to the 1$^{st}$ aspect of the present invention, and a circuit board or an electronic component with an electrode formed on a surface thereof, so that a face on which the solder powders have been loaded faces a face on which the electrode has been formed, carrying out heating and pressurization, and allowing the solder powders to be diffused and joined to the electrode;

a peeling-off liquid infiltrating step of allowing a peeling-off liquid containing a flux component to infiltrate the adhesive layer via a plurality of holes provided in the base layer;

a transfer substrate peeling-off step of peeling off the solder transfer substrate from the circuit board or the electronic component; and a solder layer forming step of performing heating at a melting point of solder or more to allow the solder powders to be melted.

Effects of the Invention

With the present invention, can be furnished a solder transfer substrate, a manufacturing method of a solder transfer substrate, and a solder transfer method using a solder transfer substrate such that it is easier to smoothly peel off.

MODES FOR IMPLEMENTING THE INVENTION

Figure 1:
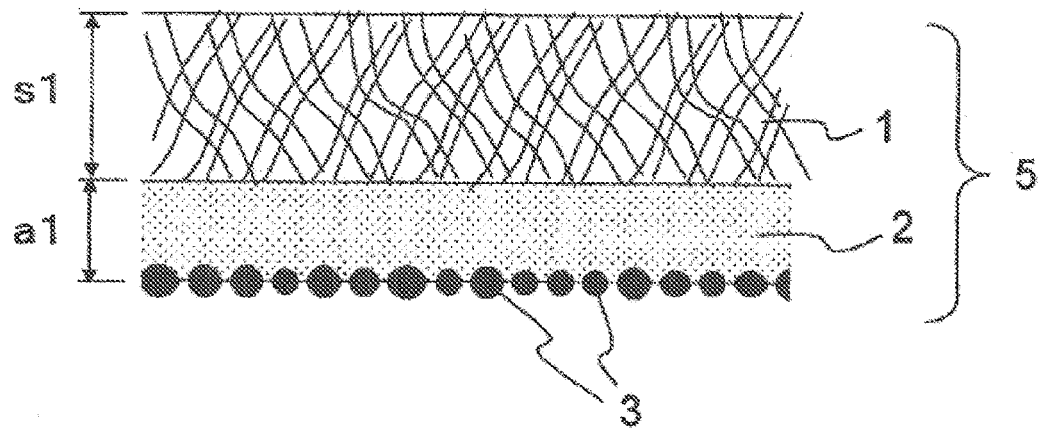
FIG. 1 is a sectional constitution view that conceptually shows the solder transfer substrate in Embodiment 1 of the present invention.

In the following, regarding embodiments of the present invention descriptions are given referring to the drawings.

Embodiment 1

In what follows, descriptions are given regarding the solder transfer substrate, the manufacturing method of the solder transfer substrate, and the manufacturing method of the semiconductor device using the solder transfer substrate in Embodiment 1 pertaining to the present invention.

FIG. 1 is a sectional constitution view that conceptually shows the solder transfer substrate in Embodiment 1 of the present invention.

As is shown in FIG. 1, the solder transfer substrate 5 of present Embodiment 1 comprises the base layer 1, the adhesive layer 2 arranged on the base layer 1, and the plural solder powders 3 that have been loaded so as to be bonded to the adhesive layer 2.

The base layer 1 is a substrate having a plurality of holes, and its thickness s1 is 0.020-2.0 mm. The said substrate having a plurality of holes is a material made of fibers, and can be used, for example, a cellulose base material such as Rintaashi (produced by TOKYO TOKUSHU SHIGYO CO., LTD., trade name), Pakopaddo (produced by Material Co., ltd., trade name) or the like, or a woven-fabric material such as Toppuboodo (produced by Yamauchi Corporation, trade name), Eesuboodo (produced by Ichikawa Keori Kabushiki-gaisha, trade name), ChuukoofurooNSboodo (produced by Chukoh Chemical Industries Ltd., trade name) or the like, or a composite material such that these are combined.

Like this, the base layer 1 absorbs, because being a substrate made of fibers and being of the structure having plural holes inside, the inclination of parallelism of the mold at the time of heating and pressurization to be mentioned later, and plays the role of a cushion material that carries out uniform heating and pressurization of the solder transfer sheet. Moreover, which will be mentioned later in detail, the base layer 1 plays the role of an infiltration material that allows the peeling-off liquid to reach the adhesive agent easily infiltrating into the material of the base layer. Additionally, this base layer 1 corresponds to one example of the porous member of the present invention.

The adhesive layer 2 is, for example, made of an adhesive agent of the acrylic system, the silicone system, the rubber system and the like.

For the solder powders 3, SnAgCu, SnAgBiIn, SnZnBi, Sn, In, SnBi and the like would be used.

The thickness a1 of the adhesive layer 2 can be set freely, correspondingly to the diameter of the solder powder 3. For example, when the diameter of the solder powder 3 is 2-12 μm, it is preferable that the thickness a1 of the adhesive layer 2 is allowed to be 5-100 μm.

Next, descriptions are given regarding the manufacturing method of the solder transfer substrate of present Embodiment 1.

In the beginning, on the base layer 1 made of cellulose with the thickness s1, the adhesive layer 2 with the thickness a1 is formed. This step corresponds to one example of the adhesive layer forming step of the present invention.

Next, the solder powders 3 are stuck onto this adhesive layer 2. As the adhesive agent of this adhesive layer 2, a rubber system resin is used. Moreover, for the solder powder 3, for example, one of components with Sn3Ag0.5Cu is used. FIGS. 2(a)-(d) are sectional constitution views for describing the solder powder loading step of present Embodiment 1.

Figure 2A:
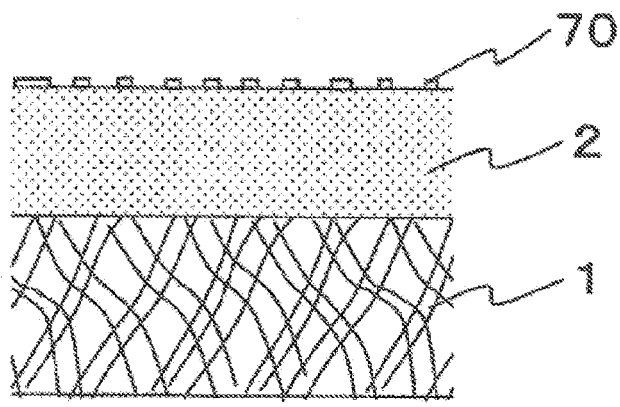
FIG. 2(a) is a sectional constitution view for describing the solder powder loading step in Embodiment 1 of the present invention.
Figure 2B:
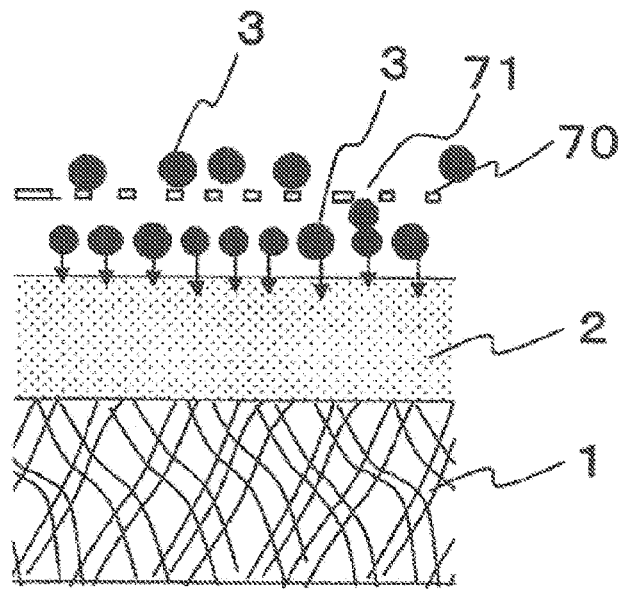
FIG. 2(b) is a sectional constitution view for describing the solder powder loading step in Embodiment 1 of the present invention.
Figure 2C:
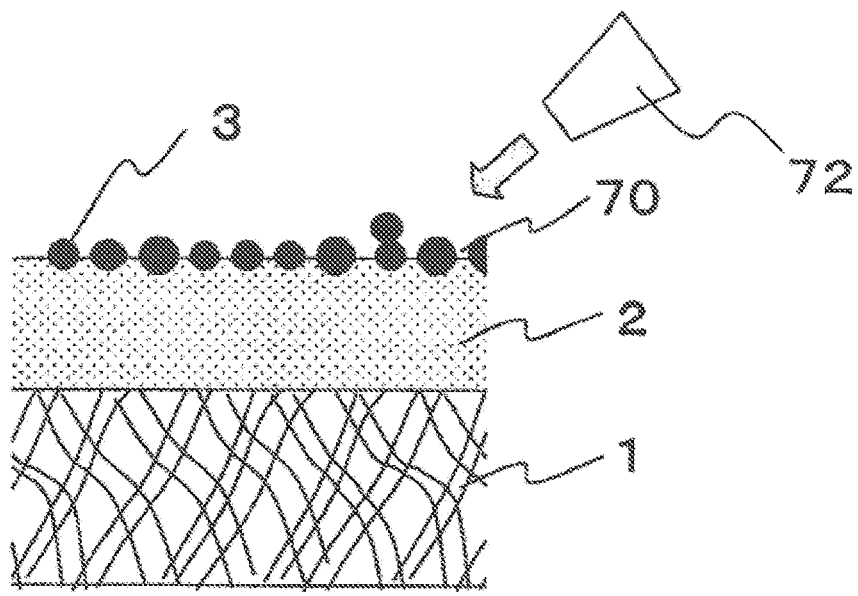
FIG. 2(c) is a sectional constitution view for describing the solder powder loading step in Embodiment 1 of the present invention.
Figure 2D:
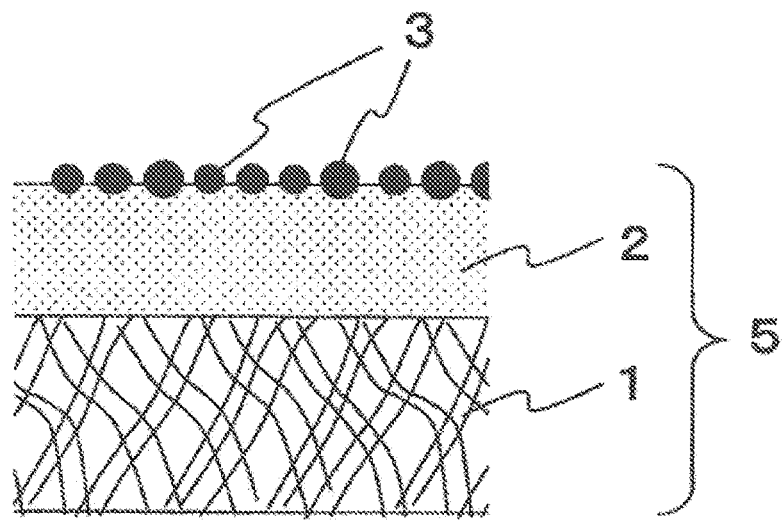
FIG. 2(d) is a sectional constitution view for describing the solder powder loading step in Embodiment 1 of the present invention.

As shown in FIG. 2(a), on the adhesive layer 2, the mask 70 is arranged in which the plural arrangement parts 71 are punched where the solder powders 3 are to be arranged. And, as shown in FIG. 2(b), after the plural solder powders 3 have been supplied from above the mask 70 by using a brush and the like, for example, the mask 70 is removed. Subsequently, as shown in FIG. 2(c), by the air blow 72, the solder powders 3 supplied except for the arrangement parts 71 are blown away, as shown in FIG. 2(d), the solder powder 3 arranged in the respective plural arrangement parts 71 are left on the adhesive layer 2, and thereby the solder transfer substrate 5 is fabricated.

Because the solder powders 3 are stuck to the adhesive layer 2 like this by using the mask 70, a space is formed between each of the solder powders 3. Moreover, by removing the superfluous solder powders 3, the solder powder 3 can be arranged so that the thickness is substantially constant. Additionally, this step of FIGS. 2(a)-(d) corresponds to one example of the solder powder loading step of the present invention. Moreover, the solder powders 3 may be supplied by sifting, which is not limited to a brush.

As illustrated in the aforementioned, the solder transfer substrate 5 is created. In present Embodiment 1, for example, the thickness s1 of the base layer 1 is set to 1.5 mm, the thickness a1 of the adhesive layer 2 to 0.050 mm, and the particle diameter of the solder powder 3 to 0.002-0.012 mm. Here, for the base layer 1 and the adhesive layer 2, the respective materials, densities and the like are set so that, in a case where the same load has been imposed in a high-temperature state (for example, 190-210° C.), for the adhesive layer 2 the compression rate becomes large in comparison with the base layer 1.

In present Embodiment 1, as the base layer 1, one such that the cellulose density has been adjusted has been used, so that the compression rate becomes 20-40% (the result with a tensilon measuring machine at the time of 0.5 MPa application).

Next, while the manufacturing method of the semiconductor device using the solder transfer substrate of present Embodiment 1 is described, mention is made at the same time also regarding one example of the solder transfer method of the present invention.

FIGS. 3(a)-(g) are sectional constitution views that conceptually show the manufacturing method of the semiconductor device using the solder transfer substrate in present Embodiment 1. In the following, using FIGS. 3(a)-(g) descriptions are given regarding the manufacturing method of the semiconductor device of present Embodiment 1.

Figure 3A:
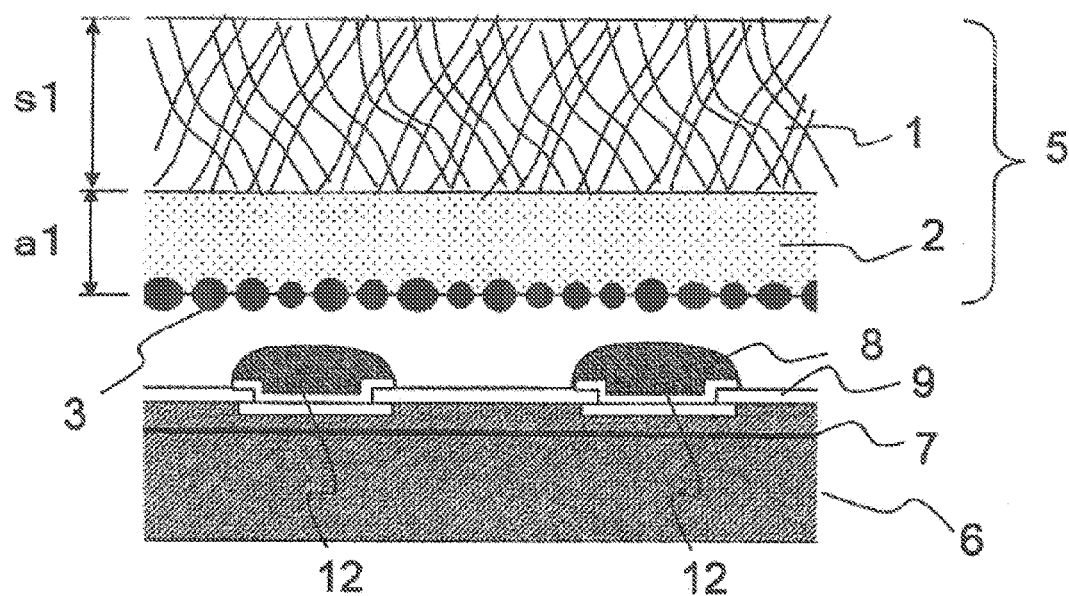
FIG. 3(a) is a sectional constitution view that conceptually shows the manufacturing method of the semiconductor device using the solder transfer substrate in Embodiment 1 of the present invention.

As is shown in FIG. 3(a), on the lower side of the solder transfer substrate 5 in the figure, the semiconductor element 6 is provided. Inside this semiconductor element 6 is formed the fragile low-dielectric-constant film (Ultra LowK) 7 and, in FIG. 3(a), on its surface on the side of the solder transfer substrate 5 are formed on the electrode pads 12 a plurality of the protruding electrodes 8 made of Au/NiP, for example. Additionally, the protruding electrodes 8 are in plan view formed in the form of a matrix. Moreover, the surface of the semiconductor element 6 of the portions on which the protruding electrodes 8 are not formed is covered with the insulating film 9 of silicon nitride and the like, for example.

For example, the protruding electrodes 8 are, with the height being 0.008-0.013 mm, formed with a pitch of 0.050 mm by an electroless plating construction method.

Additionally, the semiconductor element 6 that is here being allowed to be a target of the solder layer formation corresponds to one example of the electronic component of the present invention.

In the first place, as is shown in FIG. 3(a), the solder transfer substrate 5 and the semiconductor element 6 are arranged so that the solder powders 3 of the solder transfer substrate 5 and the protruding electrodes 8 of the semiconductor element 6 face each other.

Figure 3B:
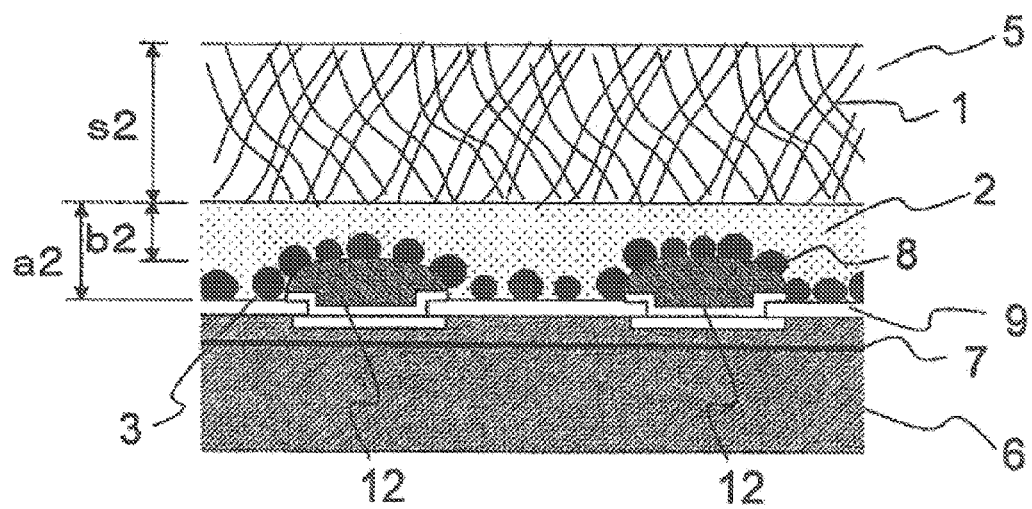
FIG. 3(b) is a sectional constitution view that conceptually shows the manufacturing method of the semiconductor device using the solder transfer substrate in Embodiment 1 of the present invention.

Next, as is shown in FIG. 3(b), the face of the solder transfer substrate 5 on which the solder powders 3 have been loaded is superposed with the face on which the protruding electrodes 8 are formed, and heating and pressurization is performed. The adhesive layer 2 softens by the heating and, as the solder powders 3 are getting buried into the adhesive layer 2, the solder powders 3 and the protruding electrodes 8 are diffused and joined with each other at the interface with the protruding electrodes 8. Additionally, because there is a space between each of the solder powders 3, and the adhesive layer 2 gets in between the solder powders 3, each of the solder powders 3 is thus not melted to get continuous with the adjacent ones. Moreover, the adhesive layer 2 that has softened is bonded with the solder powders 3 on the protruding electrodes 8 and the protruding electrodes 8.

Here, because the compression rate of the adhesive layer 2 in a high-temperature state (for example, 190-210° C.) is high in comparison with the compression rate of the base layer 1, the adhesive layer 2 is largely transformed in comparison with the base layer 1, and the thicknesses of the adhesive layer 2 differ between the portions that do not touch the protruding electrodes 8 and the portions that touch them. The thickness a2 of the portions that do not touch them is roughly equal to the initial thickness before the heating and pressurization is carried out, while the thickness b2 of the portions that touch the protruding electrodes 8 is largely compressed. For example, a2 is 0.045 mm, while b2 has become 0.030-0.035 mm. It is known that, generally, the stronger the stress at the time of bonding is, namely the more the bonding agent is compressed, the stronger the bonding strength becomes. Because of that, the protruding electrodes 8 with large compression quantities and the adhesive layer 2 are rigidly bonded. This step shown in FIG. 3(b) corresponds to one example of the solder joining step of the present invention.

Figure 3C:
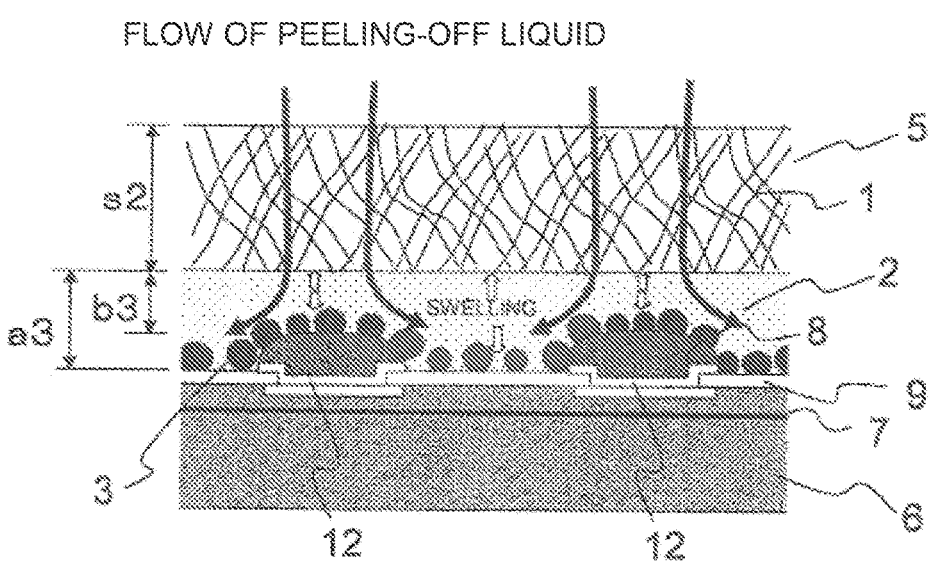
FIG. 3(c) is a sectional constitution view that conceptually shows the manufacturing method of the semiconductor device using the solder transfer substrate in Embodiment 1 of the present invention.

Next, as is shown in FIG. 3(c), the semiconductor element 6 to which the solder transfer substrate 5 has been stuck is dipped in the peeling-off liquid. For the peeling-off liquid, for example, ethanol, isopropyl alcohol and the like would be used. Here, by a plurality of holes being formed in the base layer 1, by the dipping, the peeling-off liquid infiltrates into the base layer 1, and is conveyed to the adhesive layer 2. And, the peeling-off liquid gets into the adhesive layer (see the black arrows), and the adhesive layer 2 swells in the thickness direction (see the white arrows). Further, the peeling-off liquid gets in the interface between the adhesive agent of the adhesive layer 2 and the solder powders 3, and the bonding strength between the adhesive agent and the solder powder 3, and between the adhesive agent and the protruding electrode 8 declines.

At this time, for the adhesive layer 2 of the portions that touch the protruding electrodes 8, the expansion rate becomes large, because in comparison with the portions that do not touch the protruding electrodes 8, the compression rate is high. Particularly, in the portions that touch the protruding electrodes 8, the bonding strength between the adhesive layer 2 and the protruding electrodes 8 lowers, and is also generated an effect such that the solder transfer substrate 5 becomes easy to peel off.

Additionally, heating or ultrasonic-wave application might be carried out in the liquid. In the next peeling-off step, the solder transfer substrate 5 becomes able to be peeled off with a weaker force.

Additionally, for the supplying method of the peeling-off liquid to the solder transfer substrate 5, which need not be carried out by a dipping method, any kind of method might be used provided that it is a method such that the peeling-off liquid is supplied to the whole of the solder transfer substrate 5, with a spin coat, a dispenser, potting, a coater and the like. This step shown in FIG. 3(c) corresponds to one example of the peeling-off liquid infiltrating step of the present invention.

Figure 3D:
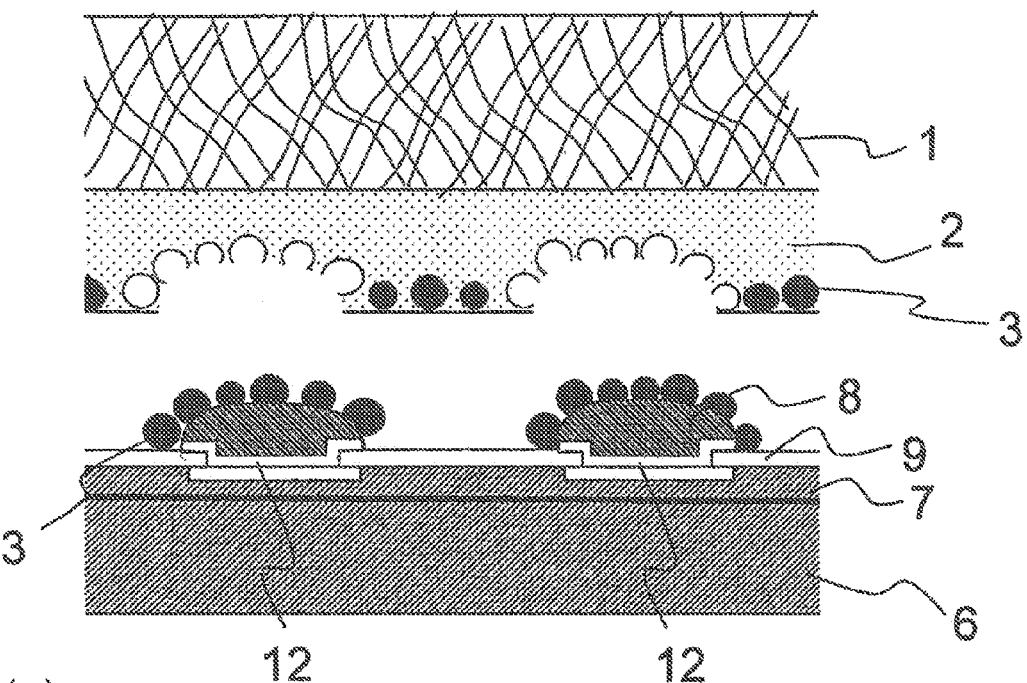
FIG. 3(d) is a sectional constitution view that conceptually shows the manufacturing method of the semiconductor device using the solder transfer substrate in Embodiment 1 of the present invention.

Next, as is shown in FIG. 3(d), the solder transfer substrate 5 is peeled off from the semiconductor element 6. The solder powders 3 on the protruding electrodes 8 are, because joined with the protruding electrodes 8, left on the protruding electrodes 8. On the other hand, the solder powders 3 on the insulating film 9 outside the protruding electrodes 8 are, because the bonding strength between the solder and the adhesive agent (the adhesive layer 2) is more than the bonding strength between the adhesive agent (the adhesive layer 2) and the insulating film 9, taken away by the adhesive layer 2 on the side of the solder transfer substrate 5. In this way, the solder powders 3 become in a state of being joined onto the protruding electrodes 8.

Moreover, because by the peeling-off liquid dipping of the former step, the bonding strength between the bonding agent of the adhesive layer 2 and the protruding electrodes 8 is less than the interface strength of the low-dielectric-constant film 7 under the protruding electrodes 8, without causing peeling-off or fissures of the low-dielectric-constant film 7, the solder transfer substrate 5 can be peeled off. This step shown in FIG.

3(d) corresponds to one example of the transfer substrate peeling-off step of the present invention.

Figure 3E:
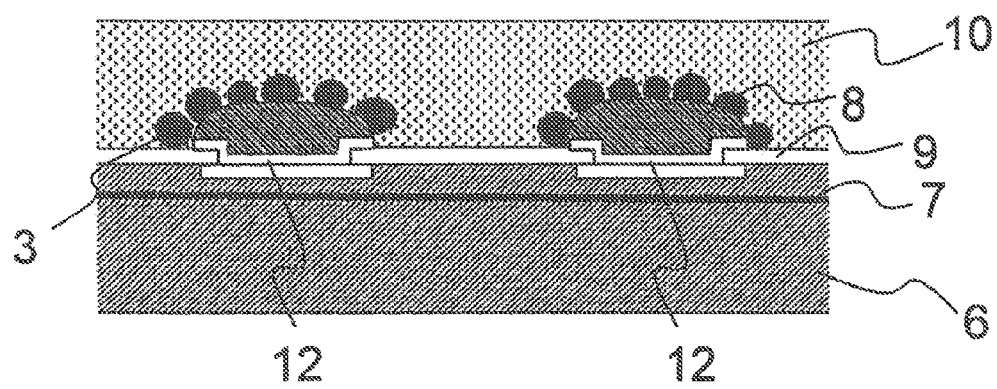
FIG. 3(e) is a sectional constitution view that conceptually shows the manufacturing method of the semiconductor device using the solder transfer substrate in Embodiment 1 of the present invention.
Figure 3F:
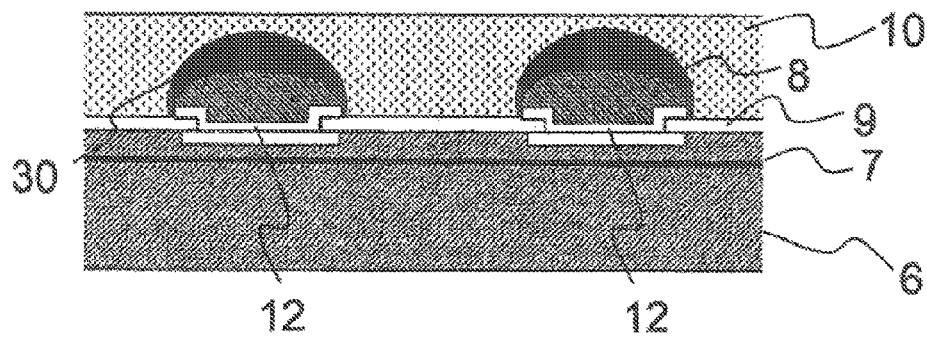
FIG. 3(f) is a sectional constitution view that conceptually shows the manufacturing method of the semiconductor device using the solder transfer substrate in Embodiment 1 of the present invention.
Figure 3G:
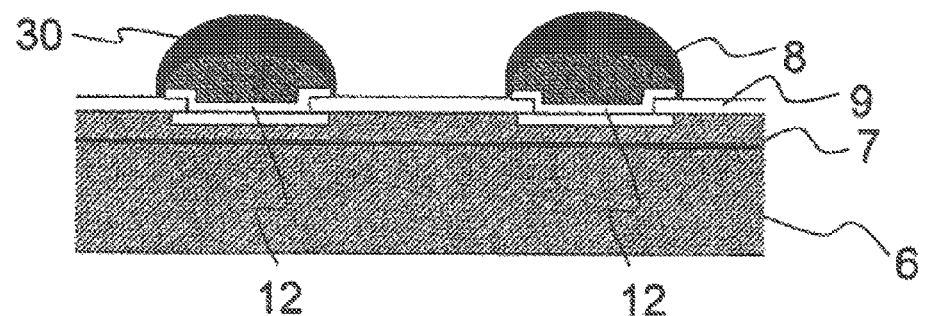
FIG. 3(g) is a sectional constitution view that conceptually shows the manufacturing method of the semiconductor device using the solder transfer substrate in Embodiment 1 of the present invention.

After this, after the flux 10 has been supplied to the surface as in FIG. 3(e), the solder powders 3 are, being deposited in a reflow furnace, completely melted as in FIG. 3(f), and the solder layer 30 is formed. The solder height becomes uniform by allowing them to be melted like this and, at the time of later flip-chip mounting, joining becomes able to be more surely carried out. After that, the flux may be removed with washing as FIG. 3(g) shows.

And, by carrying out to the board the flip-chip mounting of the semiconductor element 6 with the flux removed, the semiconductor device can be fabricated.

Here, regarding the peeling-off step of the solder transfer substrate 5, a comparison result is described.

The interface strength in the 180° peel test method between the solder transfer substrate 5 and the Au—Ni electrodes after melting of the solder powders 3 is, in a case where, as conventionally, a base layer without holes through which the peeling-off liquid passes is used and, besides no peeling-off liquid is used, 10N/25 mm, while it is decreased to 2N/25 mm with present Embodiment 1.

As illustrated in the aforementioned, with the solder transfer substrate of present Embodiment 1, because in the base layer are formed a plurality of holes that allow the peeling-off liquid to infiltrate, also in a semiconductor element possessing a fragile dielectric film, occurrence of peeling-off and fissures of the fragile dielectric film, or peeling-off and fissures of the fragile dielectric film particularly under the electrode pads can be decreased, and it becomes easy to peel off the solder transfer substrate.

Moreover, with present Embodiment 1, because the plural solder powder 3 are arranged so that the thickness is substantially constant, and they are transferred to the protruding electrodes, the dispersion of the solder transfer quantities is suppressed, and a solder layer with an appropriate thickness can be more surely formed.

Moreover, in recent years, in order to allow the productivity to improve, there is a demand for diameter-increasing of a semiconductor element (for example, a diameter of 300 mm) and size-increasing of a board but, in a mold with a large area, it is exceedingly difficult to ensure the flatness and parallelism of the upper mold and lower mold of the heating and pressurization device, and the problem is that there is a case where, the heating and pressurization in the face under the same heating condition is unable to be carried out, so that solder bridge inferiority or solder transfer quantity insufficiency occurs. However, in present Embodiment 1, the base layer 1 absorbs, because being a substrate made of fibers and having a cushioning property, the inclination of parallelism of the mold at the time of heating and pressurization, and plays the role of a cushion material that carries out uniform heating and pressurization of the solder transfer sheet.

Because of that, also in a semiconductor element with a large diameter, it becomes possible to carry out heating and pressurization in the face under a more uniform heating condition.

Embodiment 2

In what follows, descriptions are given regarding the solder transfer substrate, the manufacturing method of the solder transfer substrate, and the manufacturing method of the semiconductor device using the solder transfer substrate in Embodiment 2 pertaining to the present invention.

The basic constitution of the solder transfer substrate of present Embodiment 2 is the same as that of Embodiment 1, but the compression rates of the base layer and the adhesive layer in high-temperature states are different from those of Embodiment 1. Additionally, identical reference numerals have been assigned regarding the constitution similar to that of Embodiment 1.

FIGS. 4(a)-(g) are sectional constitution views that conceptually show the manufacturing method of the semiconductor device using the solder transfer substrate 50 in present Embodiment 2.

Figure 4A:
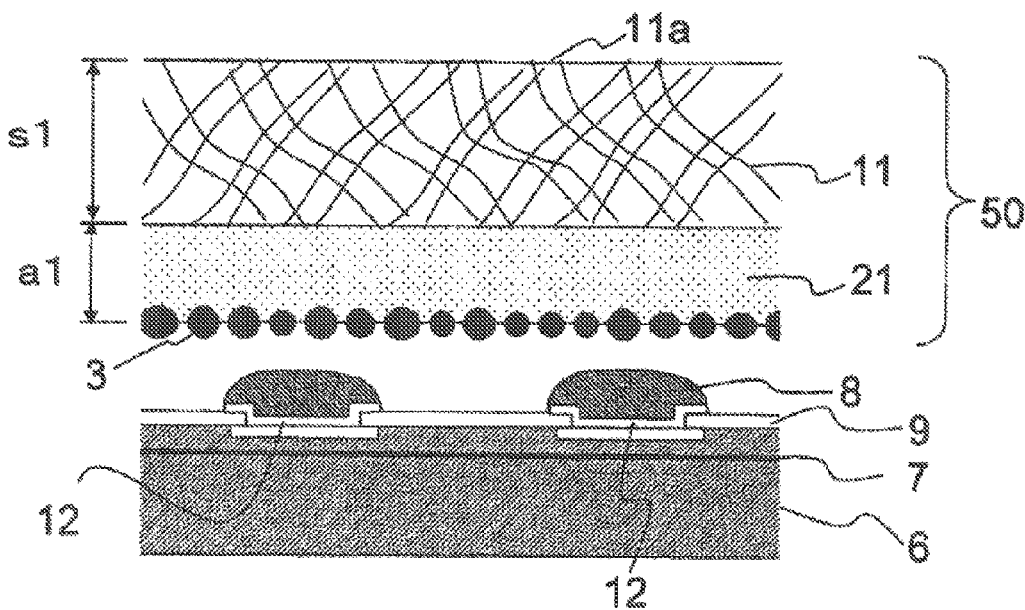
FIG. 4(a) is a sectional constitution view that conceptually shows the manufacturing method of the semiconductor device using the solder transfer substrate in Embodiment 2 of the present invention.

As is shown in FIG. 4(a), the solder transfer substrate 50 of present Embodiment 2 comprises the base layer 11, the adhesive layer 21 arranged on the base layer 11, and the plural solder powders 3 that have been loaded so as to be bonded to the adhesive layer 21.

The base layer 11 is a substrate having a plurality of holes, and its thickness s1 is 0.020-2.0 mm. The said substrate having a plurality of holes is a material made of fibers, and can be used, for example, a cellulose base material such as Rintaashi (produced by TOKYO TOKUSHU SHIGYO CO., LTD., trade name), Pakopaddo (produced by Material Co., Ltd., trade name) or the like, or a woven-fabric material such as Toppuboodo (produced by Yamauchi Corporation, trade name), Eesuboodo (produced by Ichikawa Keori Kabushikigaisha, trade name), ChuukoofurooNSboodo (produced by Chukoh Chemical Industries Ltd., trade name) or the like, or a composite material such that these are combined.

The adhesive layer 21 is, for example, made of an adhesive agent of the acrylic system, the silicone system, the rubber system and the like. For the solder powders 3, SnAgCu, SnAgBiIn, SnZnBi, Sn, In, SnBi and the like would be used.

Here, as a result of pushing-in of the base layer and the adhesive layer 21 with the same load, the compression rate of the base layer 11 in a high-temperature state (for example, 190-210° C.) is large in comparison with the compression rate of the adhesive layer 21. Namely, in present Embodiment 2, the size relation of the compression rate of the base layer 11 and the adhesive layer 21 in high-temperature states is opposite to that of the base layer 1 and the adhesive layer 2 of Embodiment 1.

Additionally, for the manufacturing method of the solder transfer substrate 50 of present Embodiment 2, similarly to Embodiment 1, on the base layer 11 made of cellulose with the thickness s1, the adhesive layer 21 with the thickness a1 is formed. As the adhesive agent of the adhesive layer 21, a rubber system resin is used. Next, the solder powders 3 are stuck onto this adhesive layer 21, and the solder transfer substrate 50 is fabricated. Additionally, for the solder powder 3, for example, one of components with Sn3Ag0.5Cu is used, and for the adhesive agent has been used one made of a rubber system resin, for example.

In present Embodiment 2, for example, the thickness s1 of the base layer 11 is set to 1.5 mm, the thickness a1 of the adhesive layer 21 to 0.050 mm, and the solder particle diameter to 0.002-0.012 mm. Here, in present Embodiment 2, as the base layer 11, one such that the cellulose density has been adjusted has been used, so that the compression rate becomes 70-95% (the result with a tensilon measuring machine at the time of 0.5 MPa application). Like this, by adjusting the cellulose density, the compression rate of the base layer 11 can be allowed to be one different from that of Embodiment 1.

As illustrated in the above-mentioned, for the base layer 11 and the adhesive layer 21, the respective materials, densities and the like are set so that, in a case where the same load has been imposed in a high-temperature state (for example, 190-210° C.), for the base layer 11 the compression rate becomes large in comparison with the adhesive layer 21.

Next, while descriptions are given regarding the manufacturing method of the semiconductor device using the solder transfer substrate of present Embodiment 2, mention is made at the same time also regarding one example of the solder transfer method of the present invention.

As shown in FIG. 4(a), inside the semiconductor element 6, the fragile low-dielectric-constant film (Ultra LowK) 7 is formed as an insulating film and, on its surface on the side of the solder transfer substrate are formed on the electrode pads 12 a plurality of the protruding electrodes 8 made of Au/Ni, for example. Additionally, the protruding electrodes 8 are in plan view formed in the form of a matrix. Moreover, the surface of the semiconductor element 6 of the portions on which the protruding electrodes 8 are not formed is covered with the insulating film 9 of silicon nitride and the like, for example.

For example, the protruding electrodes 8 are, with the height being 0.008-0.013 mm, formed with a pitch of 0.050 mm by an electroless plating construction method.

In the first place, as is shown in FIG. 4(a), the solder transfer substrate 50 and the semiconductor element 6 are arranged so that on the solder powders 3 of the solder transfer substrate 50, the protruding electrodes 8 of the semiconductor element 6 face.

Figure 4B:
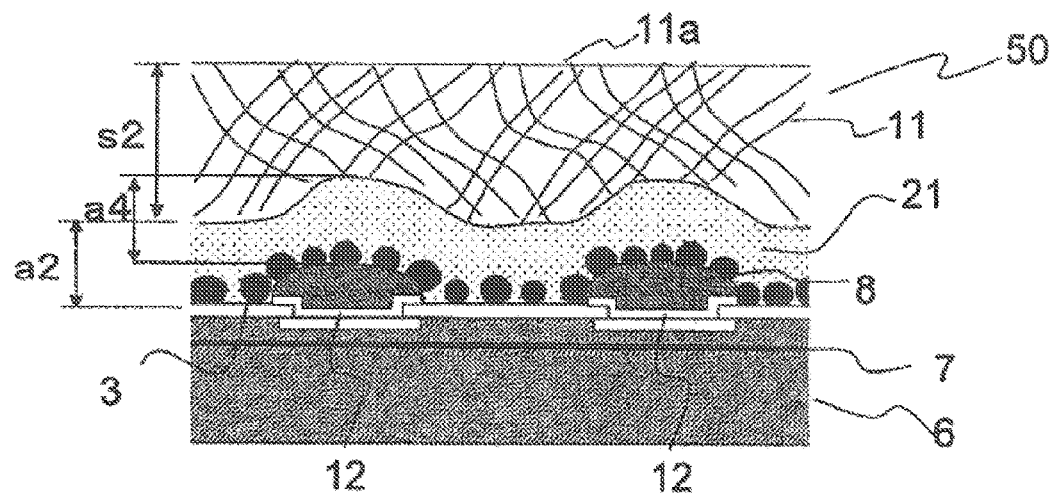
FIG. 4(b) is a sectional constitution view that conceptually shows the manufacturing method of the semiconductor device using the solder transfer substrate in Embodiment 2 of the present invention.

Next, as is shown in FIG. 4(b), with the face of the solder transfer substrate 50 on which the solder powders 3 have been loaded is superposed the face of the semiconductor element 6 on which the protruding electrodes 8 have been formed, and heating and pressurization is performed. Because the compression rate is high in comparison with the adhesive layer 21, even if the semiconductor element 6 is a wafer with a large diameter such as a diameter of 300 mm, for example, the base layer 11 works as a cushion material, absorbs the difference in the flatness and parallelism between each of the molds, and can uniformly confer the stress on the protruding electrodes in the 300 mm wafer of an area arrangement.

Moreover, because the compression rate of the base layer 11 is high in comparison with the compression rate of the adhesive layer 21, the base layer 11 absorbs the thickness of the protruding electrode 8, and is largely transformed in comparison with the adhesive layer 21. For that, both the thickness a4 of the adhesive layer 21 of the portions that touch the protruding electrodes 8 and the thickness a2 of the portions that do not touch the protruding electrodes 8, being the initial thickness a1 (before the heating and pressurization is carried out), roughly do not change. For example, a1 is 0.025 mm, while a2 and a4 become 0.022-0.025 mm. This step shown in FIG. 4(b) corresponds to one example of the solder joining step of the present invention.

Figure 4C:
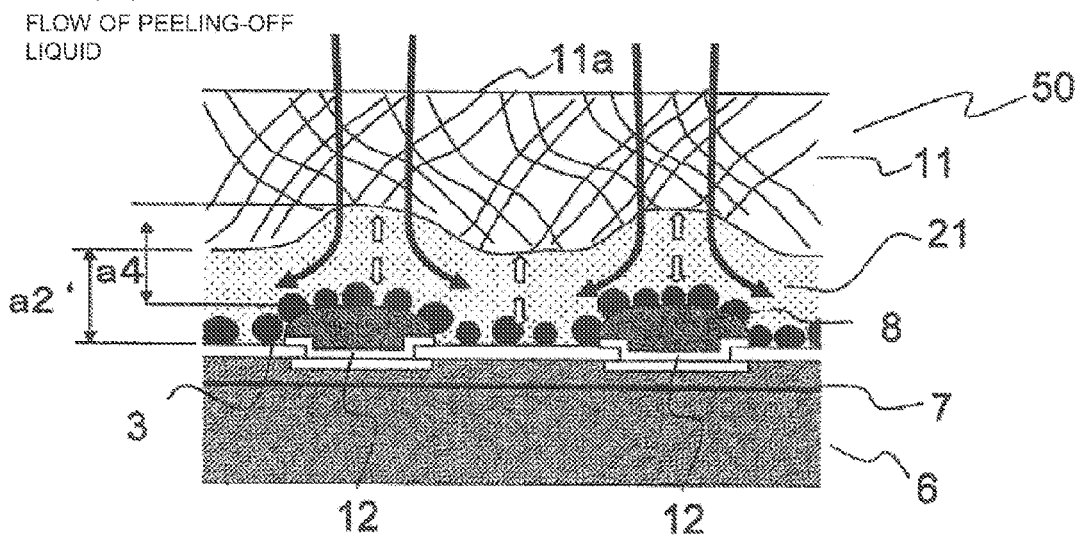
FIG. 4(c) is a sectional constitution view that conceptually shows the manufacturing method of the semiconductor device using the solder transfer substrate in Embodiment 2 of the present invention.

Next, as is shown in FIG. 4(c), the semiconductor element 6 to which the solder transfer substrate 50 has been stuck is dipped in the liquid tank in which a peeling-off liquid has been put. For the peeling-off liquid, for example, ethanol, isopropyl alcohol and the like would be used. By the dipping into the liquid tank, the peeling-off liquid infiltrates into the base layer and is conveyed to the adhesive layer 21. And, the peeling-off liquid gets into the adhesive layer 21 (see the black arrows), and the adhesive layer 21 swells in the thickness direction (see the white arrows). Further, the peeling-off liquid gets in the interface between the adhesive agent of the adhesive layer 21 and the solder powders 3, and the bonding strength between the adhesive agent of the adhesive layer 21, and the solder powder 3 and protruding electrode 8 declines.

Moreover, since the contraction rate of the thickness of the adhesive layer 21 by pressurization is small, the bonding strength between the adhesive layer and the protruding electrodes 8 becomes low, and is also generated an effect such that the solder transfer substrate 50 becomes easy to peel off.

Additionally, heating or ultrasonic-wave application might be carried out in the peeling-off liquid. By doing in this way, in the next peeling-off step, the solder transfer substrate 50 becomes able to be peeled off with a weaker force.

Additionally, for the supplying method of the peeling-off liquid to the solder transfer substrate 50, which need not be carried out by a dipping method, any kind of method might be used provided that it is a method such that the peeling-off liquid is supplied to the whole of the solder transfer substrate 50, with a spin coat, a dispenser, potting, a coater and the like. This step shown in FIG. 4(c) corresponds to one example of the peeling-off liquid infiltrating step of the present invention.

Figure 4D:
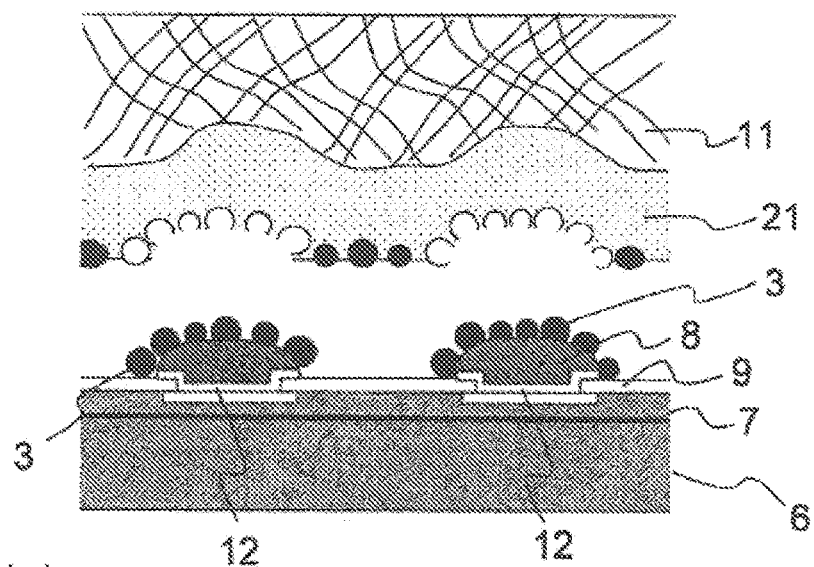
FIG. 4(d) is a sectional constitution view that conceptually shows the manufacturing method of the semiconductor device using the solder transfer substrate in Embodiment 2 of the present invention.

Next, as is shown in FIG. 4(d), the solder transfer substrate 50 is peeled off. The solder powders on the protruding electrodes 8 are, because joined with the protruding electrodes 8, left on the protruding electrodes 8. On the other hand, the solder powders 3 on the insulating film 9 outside the protruding electrodes 8 are, because the bonding strength between the solder and the adhesive agent (the adhesive layer 21) is more than the bonding strength between the adhesive agent (the adhesive layer 21) and the insulating film 9, taken away to the adhesive layer 21 on the side of the solder transfer substrate 50. In this way, the solder powders 3 become in a state of being joined onto the protruding electrodes 8.

Moreover, because by the peeling-off liquid dipping of the former step, the bonding strength between the adhesive layer 21 and the protruding electrodes 8 is less than the interface strength of the low-dielectric-constant film 7 under the protruding electrodes 8, without causing peeling-off or fissures of the low-dielectric-constant film 7, the solder transfer substrate 50 can be peeled off. This step shown in FIG. 4(d) corresponds to one example of the transfer substrate peeling-off step of the present invention.

Figure 4E:
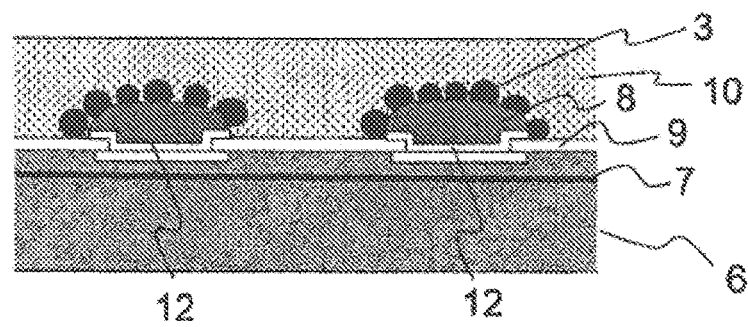
FIG. 4(e) is a sectional constitution view that conceptually shows the manufacturing method of the semiconductor device using the solder transfer substrate in Embodiment 2 of the present invention.
Figure 4F:
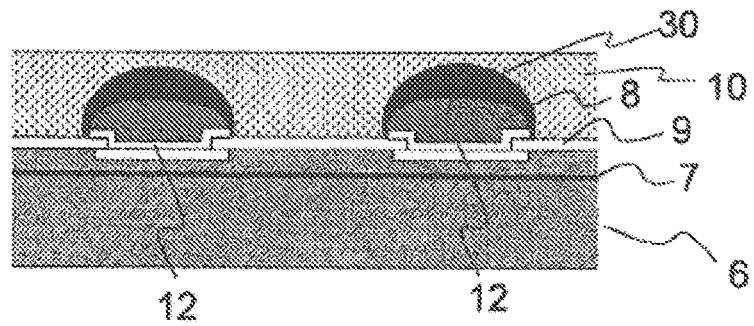
FIG. 4(f) is a sectional constitution view that conceptually shows the manufacturing method of the semiconductor device using the solder transfer substrate in Embodiment 2 of the present invention.
Figure 4G:
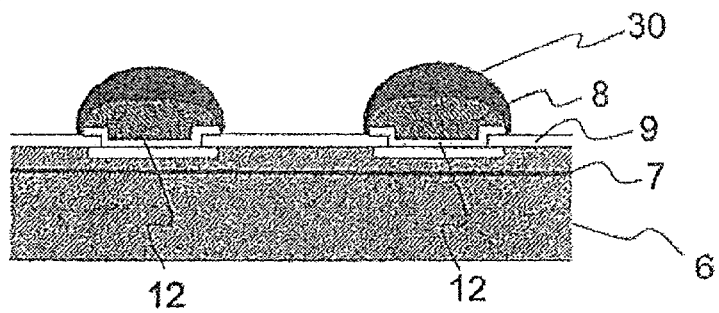
FIG. 4(g) is a sectional constitution view that conceptually shows the manufacturing method of the semiconductor device using the solder transfer substrate in Embodiment 2 of the present invention.

After this, after the flux 10 has been supplied to the surface as in FIG. 4(e), the solder powders 3 are, being deposited in a reflow furnace, completely melted as in FIG. 4(f), and the solder layer 30 is formed. After that, the flux may be removed with washing as FIG. 4(g) shows. The solder height becomes uniform by allowing them to be melted and, at the time of flip-chip mounting, joining becomes able to be more surely carried out. And, by carrying out the flip-chip mounting of the semiconductor element 6, the semiconductor device can be fabricated.

With present Embodiment 2, not only the bonding strength is lowered by allowing the adhesive layer 21 to expand similarly to Embodiment 1, but it becomes possible to peel off the solder transfer substrate from the semiconductor element 6 with weaker peeling-off strength, because the bonding strength with the protruding electrodes, by the compression rate of the adhesive layer 21 being smaller compared to Embodiment 1, also becomes smaller. For example, the interface strength between the solder transfer substrate 50 and the Au—Ni electrodes after melting of the solder powders 3, by the 180° peel test method is decreased from 10N/25 mm to 1N/25 mm.

Embodiment 3

In what follows, descriptions are given regarding the solder transfer substrate, the manufacturing method of the solder transfer substrate, and the manufacturing method of the semiconductor device using the solder transfer substrate in Embodiment 3 pertaining to the present invention.

In present Embodiment 3, the solder transfer substrate 50 similar to that of Embodiment 2 is used, but it is different in the supplying method of the peeling-off liquid and in that the peeling-off liquid contains a flux component. Because of that, descriptions are given mainly on the points of difference from Embodiment 2. Additionally, for the constitution similar to that of Embodiment 2, identical reference numerals have been assigned.

FIGS. 5(a)-(f) are sectional constitution views that conceptually show the manufacturing method of the semiconductor device using the solder transfer substrate in Embodiment 3 of the present invention.

Figure 5A:
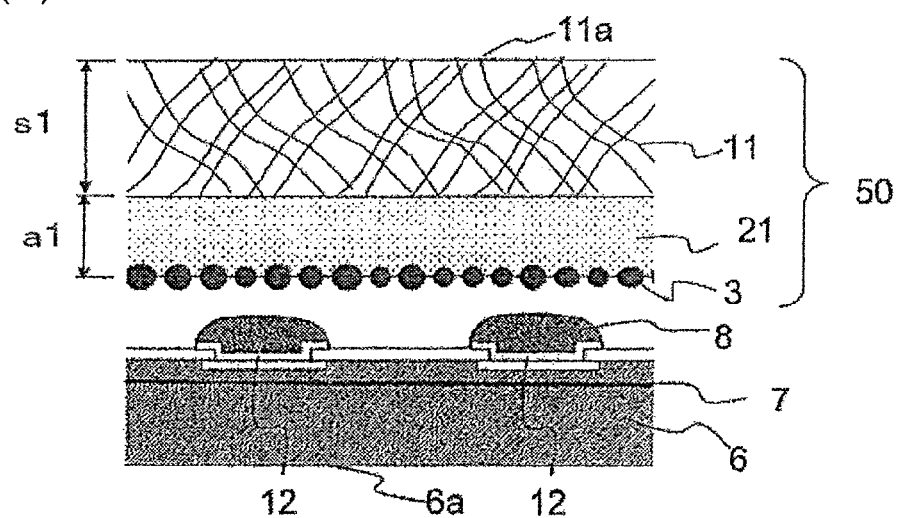
FIG. 5(a) is a sectional constitution view that conceptually shows the manufacturing method of the semiconductor device using the solder transfer substrate in Embodiment 3 of the present invention.
Figure 5B:
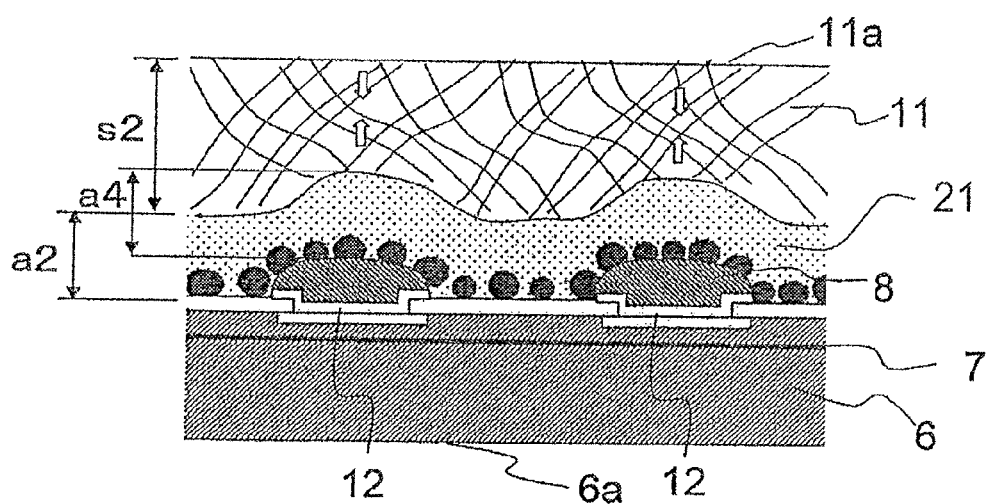
FIG. 5(b) is a sectional constitution view that conceptually shows the manufacturing method of the semiconductor device using the solder transfer substrate in Embodiment 3 of the present invention.

Because FIGS. 5(a) and (b) are similar to FIGS. 4(a) and (b) of Embodiment 2, descriptions are omitted.

Figure 5C:
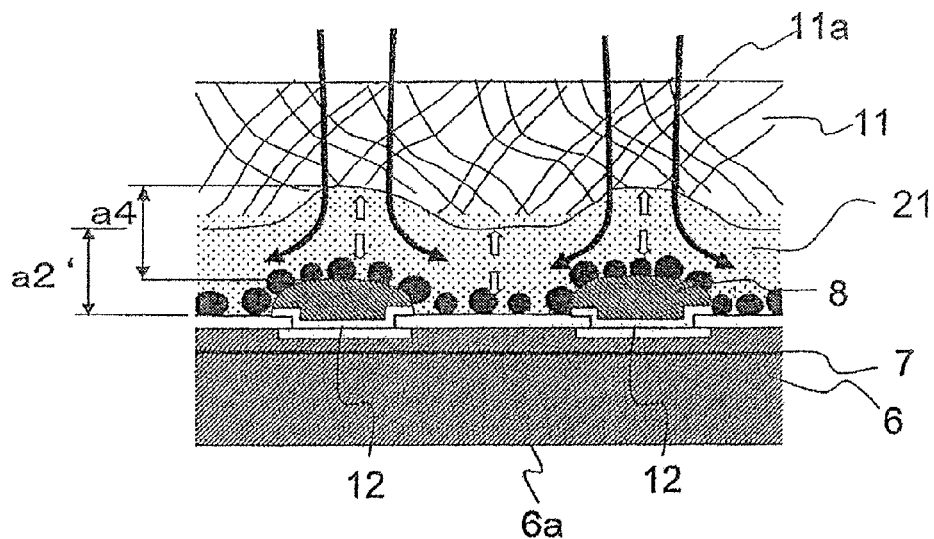
FIG. 5(c) is a sectional constitution view that conceptually shows the manufacturing method of the semiconductor device using the solder transfer substrate in Embodiment 3 of the present invention.

As is shown in FIG. 5(c), for example, by a peeling-off liquid supplying means such as a dispenser, a spin coater, potting, a bar coater and the like, the peeling-off liquid is supplied to the whole area of the reverse face 11a of the base layer 11. The flux component is included in this peeling-off liquid. The said peeling-off liquid gradually infiltrates into the said base layer 11 having air holes inside and, after having been conveyed in the adhesive layer 21, is conveyed to the interface between the protruding electrodes 8 and the adhesive layer 21. And, the adhesive layer 21 swells in the thickness direction. In the figure, the flow of the peeling-off liquid is shown with the black arrows, and the swelling is shown with the white arrows. This step shown in FIG. 5(c) corresponds to one example of the peeling-off liquid infiltrating step of the present invention.

Figure 5D:
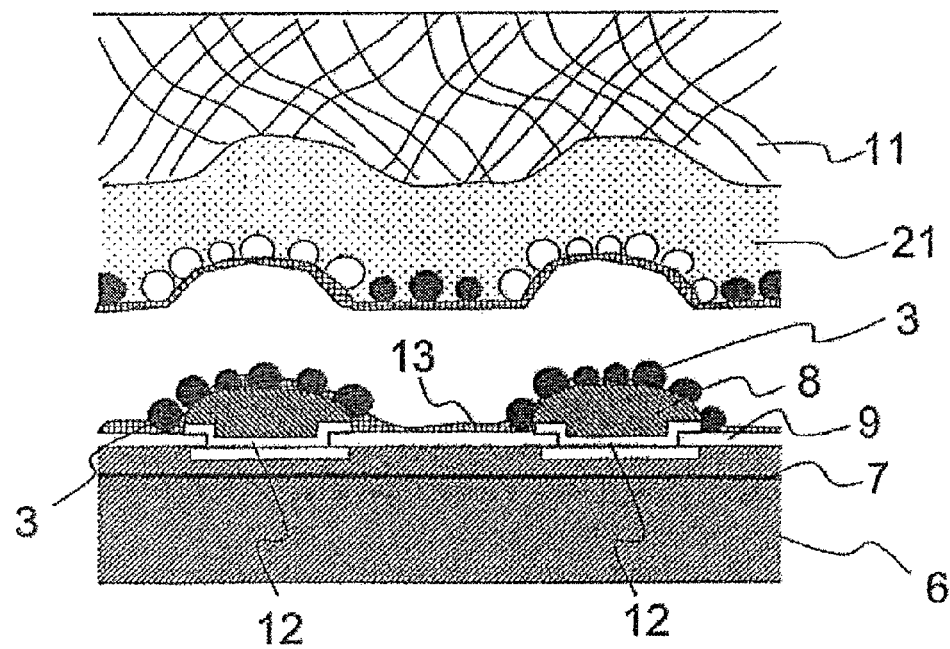
FIG. 5(d) is a sectional constitution view that conceptually shows the manufacturing method of the semiconductor device using the solder transfer substrate in Embodiment 3 of the present invention.

As is shown in FIG. 5(d), while the solder transfer substrate 50 is peeled off, the solder powders on the protruding electrodes 8 are covered over with the flux component. Here, the flux component, because having a function of a releasing material, can lower the bonding strength between the adhesive layer 21 and the protruding electrodes 8, and it becomes possible to carry out peeling-off with lower strength. Additionally, in FIG. 5(d), the flux component is shown with the reference numeral 13.

Figure 5E:
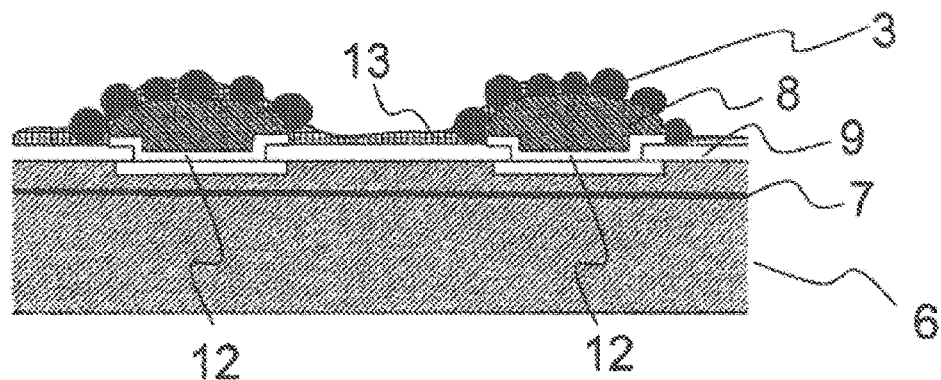
FIG. 5(e) is a sectional constitution view that conceptually shows the manufacturing method of the semiconductor device using the solder transfer substrate in Embodiment 3 of the present invention.
Figure 5F:
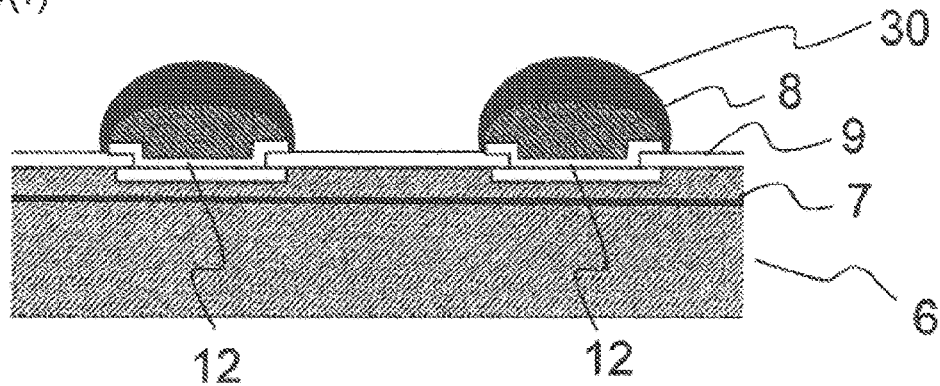
FIG. 5(f) is a sectional constitution view that conceptually shows the manufacturing method of the semiconductor device using the solder transfer substrate in Embodiment 3 of the present invention.

Next, as is shown in FIG. 5(e) and FIG. 5(f), the semiconductor element 6 covered with the flux component 13 is deposited in a reflow furnace, the solder powders 3 are melted, and the solder layer 30 is formed. This step shown in FIG. 5(e) countervails one example of the solder layer forming step of the present invention.

Subsequently, as is shown in FIG. 5(f), the flux residue is removed by washing.

Here, because the flux covers the protruding electrodes after the peeling-off, a flux supplying step by a fluxer, a flux supplying device or the like becomes unnecessary, the manufacturing steps are reduced, and an effect such that the productivity improves is also generated.

And, the semiconductor device is fabricated by carrying out to the board the mounting of the semiconductor element 6 by flip-chip mounting and the like.

With the supplying means of the peeling-off liquid of present Embodiment 3, since the supplying is not carried out on the reverse face 6a of the semiconductor element 6 or the reverse face of the board where supplying of the peeling-off liquid is not necessary, because the supplying quantity and supplying place of the peeling-off liquid can be controlled, the step of removing the peeling-off liquid that has attached to the reverse face becomes unnecessary, and an effect such that the productivity improves is generated. Moreover, with the present supplying means, because the peeling-off liquid before supplying is stored in an airtight container such as a syringe, for example, the exchanging life of the peeling-off liquid can be prolonged, and also is generated an effect such that the productivity improves.

Additionally, in present Embodiment 3, the peeling-off liquid containing a flux component has been supplied with a dispenser and the like, but dipping in the liquid tank in which such a peeling-off liquid has been put may be carried out.

Embodiment 4

In what follows, descriptions are given regarding the solder transfer substrate, the manufacturing method of the solder transfer substrate, and the manufacturing method of the semiconductor device using the solder transfer substrate in Embodiment 4 pertaining to the present invention.

The solder transfer substrate of present Embodiment is the same as that of Embodiment 1 in the basic constitution, but is different in the constitution of the base layer and in that through holes are formed that penetrate the base layer and the adhesive layer, and is different in the supplying method of the peeling-off liquid. Because of that, descriptions are given mainly on the present points of difference. Additionally, regarding the constitution identical to that of Embodiment 1 have been assigned identical reference numerals.

Figure 6A:
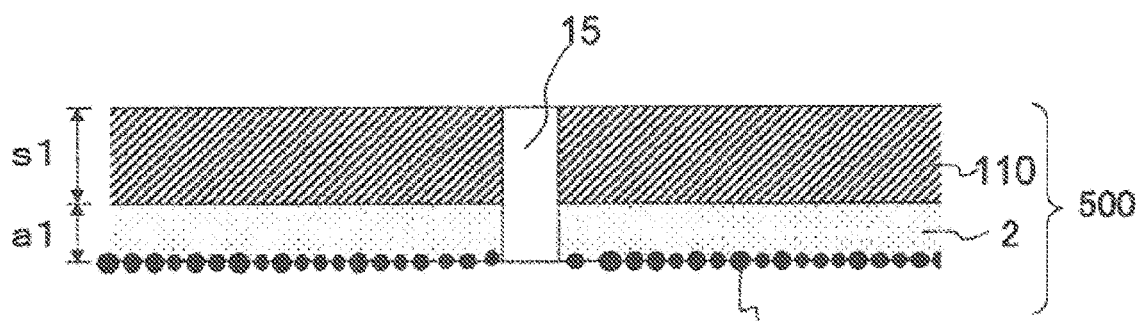
FIG. 6(a) is a sectional constitution view that conceptually shows the solder transfer substrate in Embodiment 4 of the present invention.
Figure 6B:
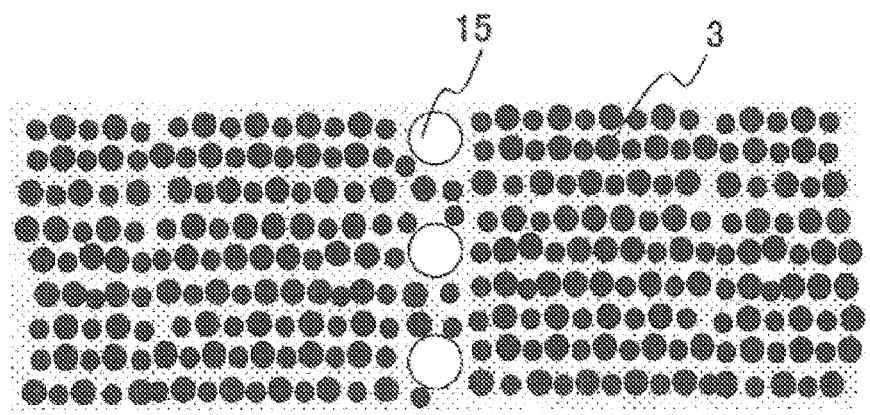
FIG. 6(b) is a plan constitution view that conceptually shows the solder transfer substrate in Embodiment 4 of the present invention.

FIG. 6(a) is a sectional constitution view that conceptually shows the solder transfer substrate 500 in Embodiment 4 of the present invention, and FIG. 6(b) is a plan constitution view that conceptually shows the solder transfer substrate 500 in Embodiment 4 of the present invention. Additionally, FIG. 6(b) is a view with the solder transfer substrate 500 viewed from below in FIG. 6(a).

As is shown in FIG. 6(a), the solder transfer substrate 500 in Embodiment 4 of the present invention comprises the base layer 110, the adhesive layer 2 that has been formed on the said base layer 110, the solder powders 3 that have been bonded onto the said adhesive layer 2, and the through holes 15 that have been provided so as to penetrate the said base layer 110 and the said adhesive layer 2.

The base layer 110 is a material with a cushioning property and, for example, silicone, rubber, PET, PEN and the like can be used. Additionally, in the raw material itself of the base layer 110 of present Embodiment 4, a plurality of holes such that it is possible for the peeling-off liquid to pass through are not formed.

Moreover, the adhesive layer 2 is, for example, made of an adhesive agent of the acrylic system, the silicone system, the rubber system and the like. Further, the solder powders 3 are made of SnAgCu, SnAgBiIn, SnZnBi, Sn, In, SnBi and the like.

Next, descriptions are given regarding the manufacturing method of the solder transfer substrate 500 in present Embodiment 4.

In the beginning, on the base layer 110 with the thickness s1, the adhesive layer 2 with the thickness a1 is formed. This step corresponds to one example of the adhesive layer forming step of the present invention.

Next, the solder powders 3 are stuck onto this adhesive layer 2. This step corresponds to one example of the solder powder loading step of the present invention.

Subsequently, the through holes 15 are formed that have penetrated the base layer 110 and the adhesive layer 2. These through holes 15 can be formed by punching and the like. This step corresponds to one example of the penetration step of the present invention.

By the steps in the aforementioned, the solder transfer substrate 5 is created. Additionally, for the solder powder 3, for example, one of components with Sn3Ag0.5Cu is used, and for the adhesive agent has been used one made of a rubber system resin, for example. In present Embodiment 4, similarly to Embodiment 1, for example, the thickness s1 of the base material is set to 1.5 mm, the thickness a1 of the adhesive layer to 0.050 mm, and the solder particle diameter to 0.002-0.012 mm.

Next, while descriptions are given regarding the manufacturing method of the semiconductor device using the solder transfer substrate of present Embodiment 4, mention is made at the same time also regarding one example of the solder transfer method of the present invention.

FIGS. 7(a)-(d) are sectional constitution views that conceptually show the solder transfer method in the manufacturing method of the semiconductor device using the solder transfer substrate in Embodiment 4 of the present invention.

Figure 7A:
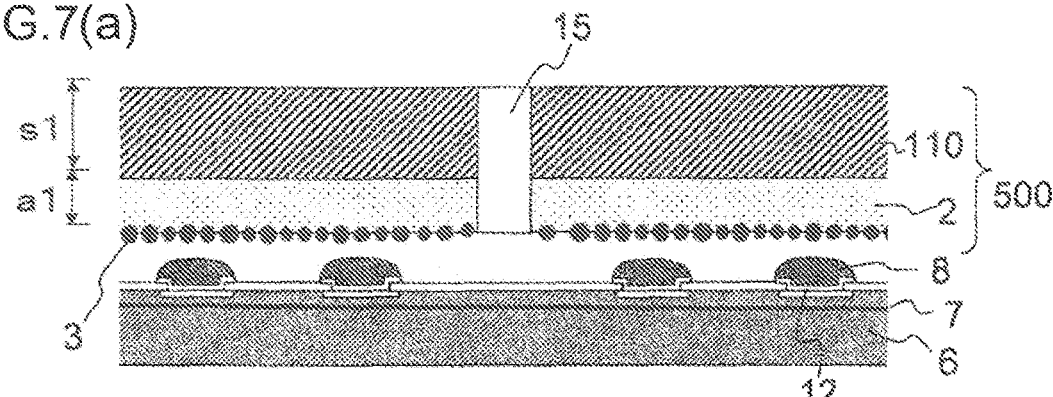
FIGS. 7(a)-(d) are sectional constitution views that conceptually show the solder transfer method in the manufacturing method of the semiconductor device using the solder transfer substrate of Embodiment 4 of the present invention.

As is shown in FIG. 7(a), on the semiconductor element 6 having the fragile low-dielectric-constant film 7 (for example, Extremely Low-k), the protruding electrodes 8 are plurally provided on a matrix in an area arrangement. The protruding electrodes 8 are formed on the electrode pads 12, are made of Cu, for example, and are provided with a pitch of 0.040 mm at equal intervals, with the height being 0.020 mm. The said solder transfer substrate 500 is arranged so that its solder powders 3 face the protruding electrodes 8 of the semiconductor element 6.

Figure 7B:
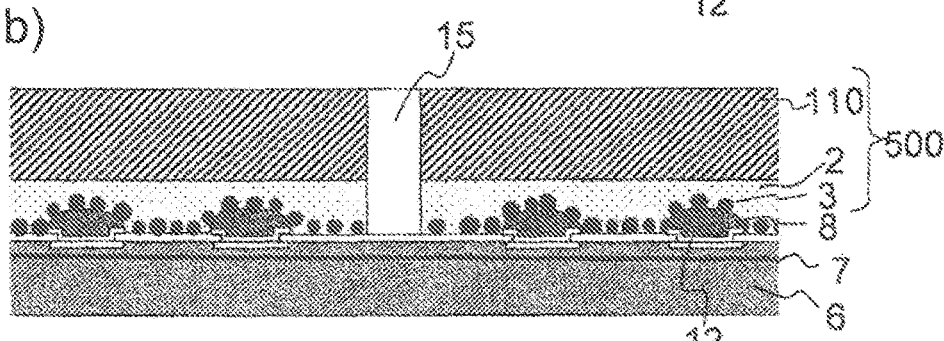

Next, as is shown in FIG. 7(b), the face on which the solder powders 3 of the solder transfer substrate 500 are loaded, and the face on which the protruding electrodes 8 of the semiconductor element 6 are formed are superposed to carry out heating and pressurization, and the adhesive layer 2 is compressed and transformed. Here, the adhesive layer 2 and the protruding electrodes are bonded. This step shown in FIG. 7(b) corresponds to one example of the solder joining step of the present invention.

Figure 7C:
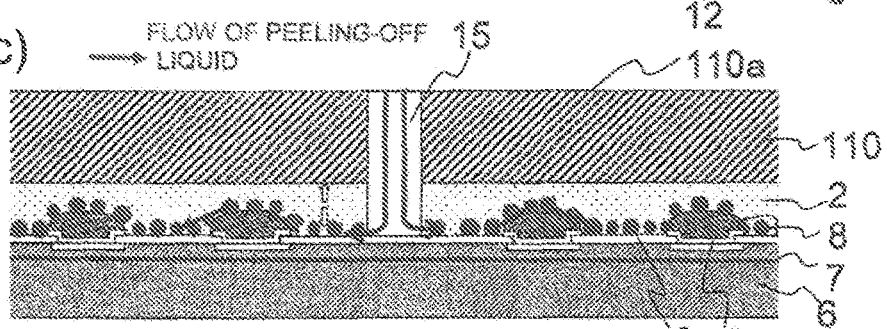

Next, as is shown in FIG. 7(c), to the reverse face 110a of the solder transfer substrate 500, the peeling-off liquid is supplied. Then, the peeling-off liquid goes through the through holes 15, gets to the adhesive layer 2, and allows the adhesive layer 2 to swell. By this function, the bonding strength between the adhesive layer 2 and the protruding electrodes 8 is decreased. In the figure, the flow of the peeling-off liquid is shown with the black arrows, and the swelling is shown with the white arrows. This step shown in FIG. 7(c) corresponds to one example of the peeling-off liquid infiltrating step of the present invention.

Figure 7D:
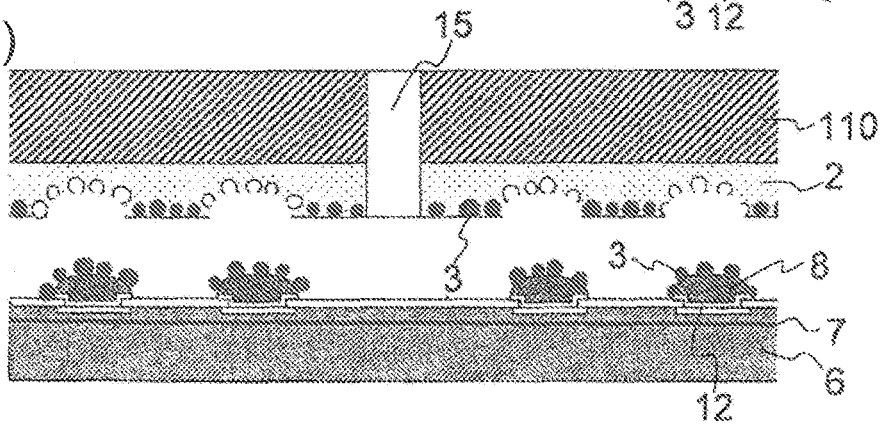

As is shown in FIG. 7(d), in the step of peeling off the solder transfer substrate 500 from the semiconductor element 6, it can be peeled off with lower strength. This step shown in FIG. 7(d) corresponds to one example of the transfer substrate peeling-off step of the present invention. The later steps are similar to those of Embodiment 1.

As illustrated in the aforementioned, in present Embodiment 4, because the base layer 110 can, even if being a dense raw material that does not hold a plurality of air holes such that it is possible for the peeling-off liquid to pass through, infuse the peeling-off liquid via the through holes, it becomes easy to infuse the peeling-off liquid into the interface between the solder transfer substrate and the protruding electrode. Further, with the present infusing method, is generated an effect such that, in comparison to the case of utilizing the plural holes, the peeling-off liquid becomes easier to convey particularly to the in-between of the solder powders that have been bonded with the protruding electrodes and the adhesive layer.

Moreover, since the base layer 110 itself is a material with a cushioning property, also with respect to the protruding electrodes on a large-sized glass epoxy board of 450 mm×450 mm, for example, the base layer 110 absorbs the parallelism and flatness between the molds, and can uniformly confer the stress on the protruding electrodes.

Additionally, also in present Embodiment 4, similarly to above-mentioned Embodiment 3, a flux component may be included in the peeling-off liquid.

Moreover, also in present Embodiment 4, the base layer 1 or 11 may be used in which a plurality of holes as in Embodiment 1 or Embodiment 2 have been formed that allow the peeling-off liquid to pass through towards the side of the adhesive layer 2. In this case, the peeling-off liquid then passes through from the through holes 15 and the holes of the raw material itself of the base layer 1 or 11.

Additionally, in the solder transfer substrate 500 of present Embodiment 4, the through holes 15 have penetrated both of the base layer 110 and the adhesive layer 2, but the constitution may be that they penetrate in the middle of the adhesive layer 2, or the constitution may be that they have penetrated only the base layer 110.

Moreover, in the present embodiment, after on the base layer 110 the plural solder powders 3 have been stuck to the adhesive layer 2, the through holes 15 have been formed, but the order is not limited to this. Namely, in a case where the through holes are formed only in the base layer 110, the through holes may be formed in the base layer 110 before the adhesive layer 2 is formed and, in a case where the through holes are formed in the base layer 110 and the adhesive layer 2, before the plural solder powders 3 are stuck, the through holes may be formed.

Moreover, in present Embodiment 4, descriptions have been given supposing that regarding the base layer 110 a cushioning property is involved, but rigidity may be involved.

Figure 8:
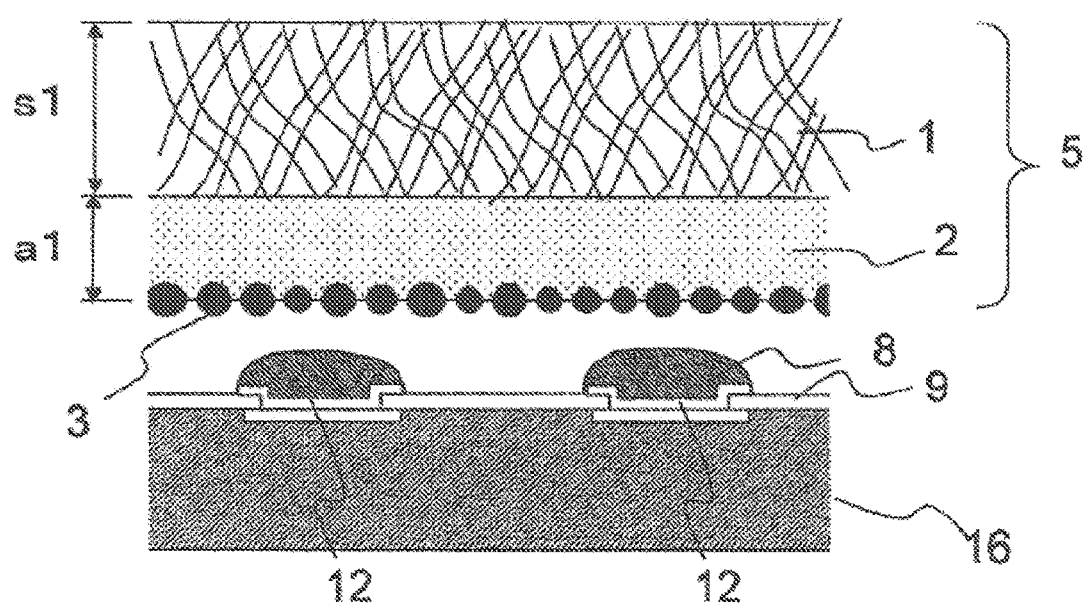
FIG. 8 is a sectional constitution view that shows the solder transfer substrate of Embodiment 1 of the present invention and the circuit board arranged to face it.
Figure 9A:
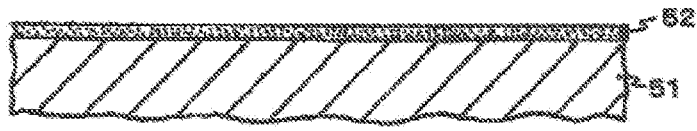
FIGS. 9(a)-(e) are explanatory drawings of the step of performing solder layer formation (precoating) in a conventional embodiment.
Figure 9B:
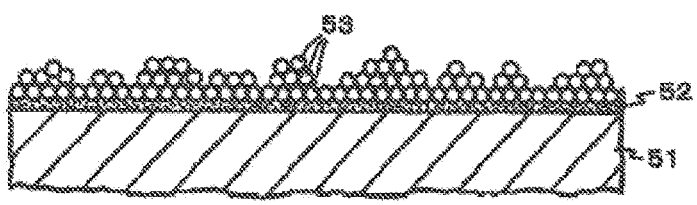
Figure 9C:
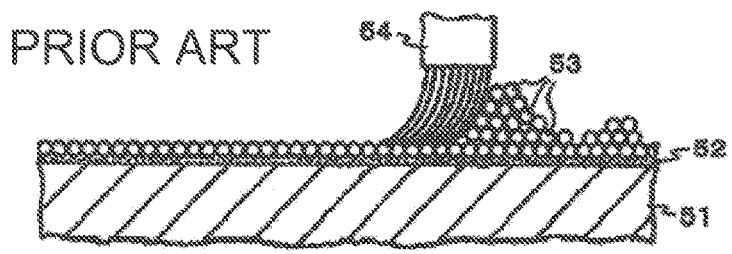
Figure 9D:
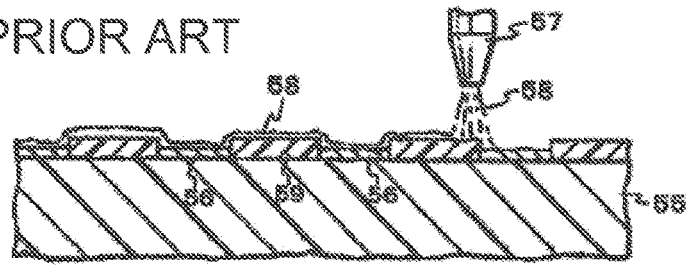
Figure 9E:
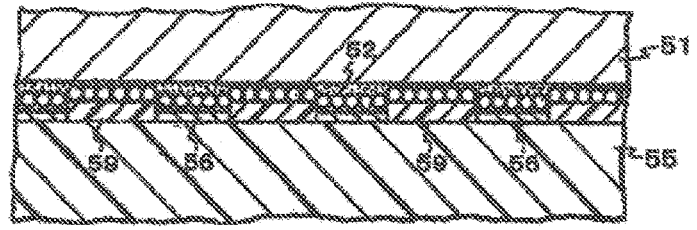
Figure 10A:
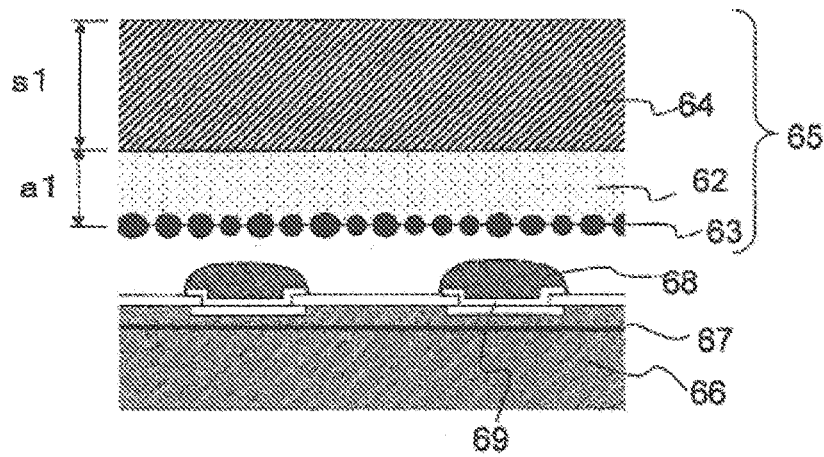
FIGS. 10(a)-(c) are enlarged sectional constitution views that conceptually show the step of forming, on the electrode terminals on a semiconductor element having a fragile low-dielectric-constant film by a conventional solder layer formation technique, solder layers.
Figure 10B:
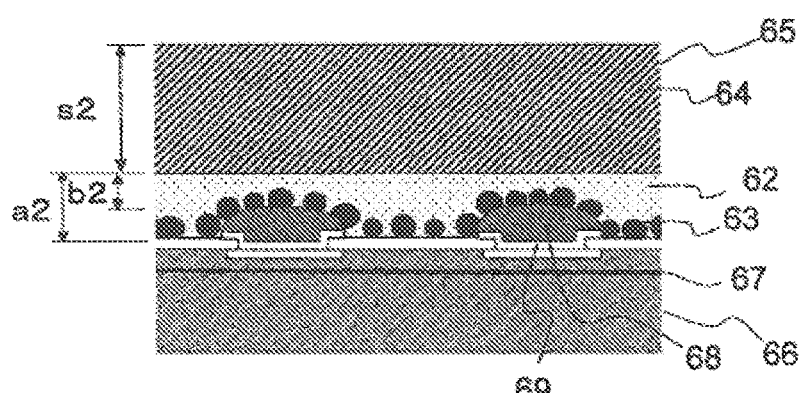
Figure 10C:
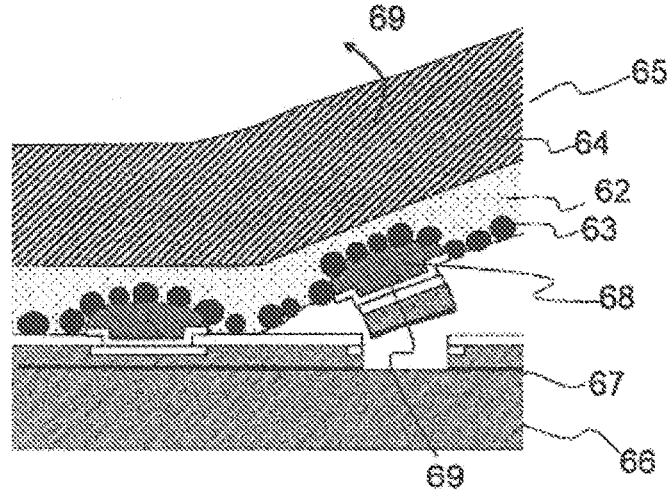

Additionally, in above-mentioned Embodiments 1-4, descriptions are given using an electronic component such as a semiconductor element and the like, but it may be, not an electronic component, a circuit board. FIG. 8 is a sectional constitution view that shows the solder transfer substrate 5 shown with Embodiment 1, and the circuit board 16 that has been arranged so as to face the solder transfer substrate 5. As shown in FIG. 8, the electrode pads 12 are formed on the substrate of the circuit board 16, and the protruding electrodes 8 are formed on the electrode pads 12. In the circuit board 16 like this, even with constitution of weak adhesion force between the substrate and the electrode pads such that, for example, the substrate is formed of silicone and that the electrode pads 12 are formed of Cu, whose adhesion force with Si is weak, by applying the present invention, peeling-off of electrode pads from the circuit board can be decreased that takes place while the solder transfer substrate is peeled off.

In the aforementioned, as has been described in Embodiments 1-4, with the solder transfer substrate of the present invention and the manufacturing method thereof, since the peeling-off liquid can be, because having a plurality of holes in the substrate, allowed to infiltrate into the adhesive layer and, as a result, the peeling-off strength of the solder transfer substrate is less than the interface strength under the electrode pads or the destruction strength of the fragile film, also in the step of peeling off the solder transfer substrate, peeling-off of the electrode pads or the fragile low-dielectric-constant film under the electrode pads for instance can be prevented.

Moreover, since the inclination of the mold, also with respect to a transfer to a large-sized board, can be absorbed, because the solder transfer substrate itself has a cushioning property, it becomes possible to carry out transfer.

Like this, with the solder transfer substrate of the present invention and the manufacturing method thereof, with respect to an electronic component such as a semiconductor element and the like having a fragile film like a low-dielectric-constant film or a circuit board, occurrence of peeling-off and fissures of the fragile film is decreased, and a solder layer with an appropriate thickness can be more surely formed with transfer.

Additionally, present Embodiments 1-4 may be implemented at the same time.

Additionally, in above-mentioned Embodiments 1-4, the adhesive layer 2 has a characteristic of expanding by infusing a peeling-off liquid, but need not have it.

Moreover, the base layers 1, 11 and 110 in above-mentioned Embodiments 1-4, any of which is a member having a cushioning property, need not have a cushioning property. Even in a case like this, by supplying a peeling-off liquid through a plurality of holes, compared with the conventional, it becomes possible to allow the solder transfer substrate to be easy to peel off from the semiconductor element.

INDUSTRIAL APPLICABILITY

A solder transfer substrate, a manufacturing method of a solder transfer substrate and a solder transfer method pertaining to the present invention have an effect of more easily peeling off a solder transfer substrate, and are useful particularly in the mounting field of mounting semiconductor elements with progress for narrow pitch, or semiconductor elements and the like having interlayer insulating films made of low-dielectric-constant materials and the like.

DESCRIPTION OF THE REFERENCE NUMERALS 1, 11, 110 base layer
2, 21 adhesive layer
3 solder powder
5, 50, 500 solder transfer substrate
6 semiconductor element
7 low-dielectric-constant film
8 protruding electrode
9 insulating film
10 flux
12 electrode pad
13 flux component
15 through hole
16 circuit board
30 solder layer

The invention claimed is:

1. A solder transfer substrate, comprising:
a base layer;
an adhesive layer arranged on the base layer; and
solder powder arranged on the adhesive layer, wherein
in the base layer, a plurality of holes, which allow at least a peeling-off liquid to pass therethrough, are formed from a side thereof on which the adhesive layer is not arranged to a side thereof on which the adhesive layer is arranged,
the base layer is larger than the adhesive layer in respect of a compression rate at a time of heating, and
the adhesive layer has a characteristic of expanding with the peeling-off liquid infused.

2. A solder transfer substrate according to claim 1, wherein the base layer is a porous member.

3. The solder transfer substrate according to claim 1, wherein
at least one of the plurality of holes is formed at least to an inside of the adhesive layer.

4. The solder transfer substrate according to claim 1, wherein
the base layer is made of a woven-fabric material.

5. The solder transfer method, comprising:
a solder joining step of superposing a solder transfer substrate and a circuit board or electronic component with an electrode formed on a surface thereof, the solder transfer substrate comprising:
a base layer;
an adhesive layer arranged on the base layer; and
solder powder arranged on the adhesive layer, wherein
in the base layer, a plurality of holes, which allow at least a peeling-off liquid to pass therethrough, are formed from a side thereof on which the adhesive layer is not arranged to a side thereof on which the adhesive layer is arranged,
the base layer is larger than the adhesive layer in respect of a compression rate at a time of heating, and
the adhesive layer has a characteristic of expanding with the peeling-off liquid infused,
the solder transfer substrate being superposed so that a face on which the solder powder has been loaded faces a face on which the electrode has been formed, carrying out heating and pressurization, and allowing the solder powder to be joined to the electrode;
a peeling-off liquid infiltrating step of allowing the peeling-off liquid to infiltrate the adhesive layer via the plurality of holes provided in the base layer; and
a transfer substrate peeling-off step of peeling-off the solder transfer substrate from the circuit board or electronic component.

6. The solder transfer method, comprising:
a solder joining step of superposing a solder transfer substrate and a circuit board or electronic component with an electrode formed on a surface thereof, the solder transfer substrate comprising:
a base layer;
an adhesive layer arranged on the base layer; and
solder powder arranged on the adhesive layer, wherein
in the base layer, a plurality of holes, which allow at least a peeling-off liquid to pass therethrough, are formed from a side thereof on which the adhesive layer is not arranged to a side thereof on which the adhesive layer is arranged,
the base layer is larger than the adhesive layer in respect of a compression rate at a time of heating, and
the adhesive layer has a characteristic of expanding with the peeling-off liquid infused,
the solder transfer substrate being superposed so that a face on which the solder powder has been loaded faces a face on which the electrode has been formed, carrying out heating and pressurization, and allowing the solder powder to be joined to the electrode;
a peeling-off liquid infiltrating step of allowing the peeling-off liquid to infiltrate the adhesive layer via the plurality of holes provided in the base layer;
a transfer substrate peeling-off step of peeling-off the solder transfer substrate from the circuit board or electronic component, and
a solder layer forming step of performing heating at a melting point of solder or more to allow the solder powders to be melted.

* * * * *